US006957979B2

(12) United States Patent
Welsh et al.

(10) Patent No.: US 6,957,979 B2
(45) Date of Patent: Oct. 25, 2005

(54) LATCH WITH BAIL-TYPE MOUNTING

(75) Inventors: Thomas W. Welsh, Philadelphia, PA (US); Michael S. Bucci, Atlanta, GA (US); Richard E. Schlack, Rising Sun, MD (US)

(73) Assignee: Southco, Inc., Concordville, PA (US)

( * ) Notice: Subject to any disclaimer, the term of this patent is extended or adjusted under 35 U.S.C. 154(b) by 158 days.

(21) Appl. No.: 10/159,890

(22) Filed: Jun. 1, 2002

(65) Prior Publication Data

US 2002/0182896 A1 Dec. 5, 2002

Related U.S. Application Data

(60) Provisional application No. 60/371,527, filed on Apr. 9, 2002, and provisional application No. 60/295,179, filed on Jun. 1, 2001.

(51) Int. Cl.$^7$ .................................................. H01R 13/73
(52) U.S. Cl. ........................................ 439/565; 439/545
(58) Field of Search ................................ 439/565, 545, 439/534, 550, 562, 555, 159, 160, 157, 152; 220/326; 360/128

(56) References Cited

U.S. PATENT DOCUMENTS 2,720,772 A 10/1955 Atkinson
3,896,698 A 7/1975 Aylott
3,957,225 A 5/1976 Vogel
4,105,234 A 8/1978 Eberhart
4,224,650 A 9/1980 Ban et al.
4,379,579 A 4/1983 Mahan et al.
4,466,680 A * 8/1984 Sakai et al. ................. 439/159
4,618,118 A 10/1986 Nardella et al.
4,633,348 A 12/1986 Takai
4,704,882 A 11/1987 Takasaki
4,892,338 A 1/1990 Weinerman et al.
5,031,942 A 7/1991 Harrod
5,048,877 A 9/1991 Rogers, Jr. et al.
5,066,247 A * 11/1991 Watson ....................... 439/565
5,419,167 A 5/1995 Yamada et al.
5,558,527 A * 9/1996 Lin ............................ 439/155
5,575,163 A 11/1996 Kohn et al.
5,607,324 A * 3/1997 Saur et al. .................. 439/565
5,619,398 A * 4/1997 Harrison et al. ............ 361/686
5,620,213 A 4/1997 Ellis
5,727,675 A 3/1998 Leveque et al.
5,941,730 A * 8/1999 Uchiyama et al. .......... 439/550
6,179,350 B1 1/2001 Ely et al.
6,203,076 B1 3/2001 Wytcherley et al.
6,354,638 B1 3/2002 Hoffmann

* cited by examiner

*Primary Examiner*—Gary Paumen
(74) *Attorney, Agent, or Firm*—Paul & Paul

(57) ABSTRACT

The present invention is a pawl latch which is adapted to be mounted to a first member, such as a closure panel of drawer face plate for releasably retaining the closure panel against an enclosure. Such drawer is suitable for implementing an electronic module which plugs into the backplane of the enclosure. The latch has spring-assisted engagement and disengagement of its pawl with the edge of an enclosure opening against which the pawl operates. This results in spring-assisted inject and eject functions for connecting and disconnecting any associate backplane connection. The latch is low profile with a narrow footprint and has an EMI and ESD event preventive coating on the surface of the housing and appropriate components thereof. A pull handle is substantially flush with the outside face of the latch housing and cooperates with a button spring activator member, when the handle is in the closed position.

72 Claims, 51 Drawing Sheets

LATCH WITH BAIL-TYPE MOUNTING

RELATED APPLICATIONS

The subject matter of this application relates to the invention disclosed in, and claims benefit of, U.S. Provisional Application No. 60/295,179, titled, Pawl Inject/Eject Latch, filed Jun. 1, 2001, and U.S. Provisional Application No. 60/371,527, titled, Sliding Panel Latch, filed Apr. 9, 2002.

BACKGROUND OF THE INVENTION

This invention relates generally to a latch for releasably securing a first member relative to a second member. The first member moves at least partially relative to the second member resulting in a secured position.

Latches are used to releasably secure panels, covers, doors, drawers, electronic modules, glove boxes, and the like to other generally larger structures, such as housings, compartments, doorframes, panel fronts, frames, racks and other structures. These latches are mounted by various means, including screws, rivets, blade fasteners, spring clips, stake fasteners and other structures. Each latch generally includes a housing portion; and includes another portion, such as a lever, pull, button, stud, catch plate or other such structural member. The housing portion performs the function of the second, non-moving member, while the other portion performs the function of the first, moving member. Each latch is mounted so that the housing portion is fixed to the generally larger structure, i.e., the doorframe, panel front, frame, rack, and other structure.

When latches are used hold electronic and power modules and circuit breakers in power and distribution panels, or in communications panels, the operation of the latch and its ability to be installed and/or removed without tools or with unsophisticated tools becomes important. Moreover, it becomes desirable that the latch has a flush outer appearance or is nearly flush with the panel face when closed. These features are also desirable when latches are used to secure and to pull-out electronic module drawers, or power module drawers, in respective communications panels or power distribution panels, such as those found in communications and power distribution centers and/or substations and transmission nodes.

Often the conventional method for mounting electronics and /or opto-electronic modules in enclosures, i.e., housings and panels includes a printed circuit board mounted to a metal face plate (panel), or a metal drawer or tray which carries modules. In the past, these modules commonly were slid into an enclosure guided by card guides, ball slides, or some other form of linear guide. In each situation, there is an electrical connector on the back of the printed circuit board or tray which engages a mating (complementary) connector mounted inside the enclosure (the enclosure back plane).

There have been various designs for latches and connectors which either include spring biasing or deformable members for quick mounting. Atkinson, U.S. Pat. No. 2,720,772, shows a bag or suitcase latch with a pop-up movement. Aylott, U.S. Pat. No. 3,896,698, shows a quick release fastener, which has button activation and spring biasing. Vogel, U.S. Pat. No. 3,957,225, shows a tape cartridge latching mechanism with a spring biased release. Mahan, et al., U.S. Pat. No. 4,379,579, show a locking and ejecting hook assembly in which a releasable latch includes a spring and cam operated ejection. Nardella, et al., U.S. Pat. No. 4,618,118, show a molded latch housing with a flanged surface installed in a rectangular cutout. A spring connected the hook at the forward end of the latch keeps the latch normally in the locked position. Shimamura, et al., U.S. Pat. No. 4,724,310, shows a spring biased integrated circuit card drawer and carrier. Rudoy, U.S. Pat. No. 4,973,255, shows torque-type locking and ejecting mechanism for a PC cable connector. Rogers, et al., U.S. Pat. No. 5,048,877, show an automobile pop-up hood latch with a cable release and a spring biased open position. Kameyama, U.S. Pat. No. 5,279,509, shows a cable connector with deformable side stakes which act as a quick engagement mount. Once in the mounted position the stakes return to their original position to lock the mounting. Kohl et al., U.S. Pat. No. 5,575,163, show a removable attachment structure for a car radio, including a deformable spring lock member. Ellis, U.S. Pat. No. 5,620,213, shows a low profile pull-type latch used as a window lock. Wytcherley, et al., U.S. Pat. No. 6,203,076, show a fold down handle for a panel with controlled pushing and pulling action. Kuroda et al., U.S. Pat. No. 6,280,206, show a high voltage cable connector with deformable socket contacts which act as a locking mechanism once the two members of the connector are joined.

Previous latches have presented problems that make them difficult or impractical to use to mount and hold removable electronic modules or communications/ power distribution drawers. Specifically, these latches do not provide an adequate user (operator) finger grasping surface to pull open. The force necessary to open these latches and thereby disengage an electrical connector is substantial enough to cause discomfort to the fingers, when a user attempted to release the latch, i.e., to open the pull member. Furthermore, the prior electronic module latches do not consider electromagnetic interference, nor do they consider shielding against such interference, nor did they provide sufficient restraint during a physical shock.

It is desirable to provide a latch, which is capable of injecting an attached structure and ejecting that attached structure with user ease, and in retaining the structure secured from jarring loose during a shock or a seismic event.

It is also desirable to provide a latch, which can be used to secure a circuit board drawer in a communications center panel or a power distribution center panel face of an enclosure within the close tolerances found.

It is further desirable to provide a latch with a flush or nearly flush face.

It is even further desirable to provide a latch with a narrow footprint and low profile, with a quick mount and quick remove features without the need for specific tools.

It is additionally desirable to provide a latch with electromagnetic interference (EMI) shielding, and grounding to prevent electrostatic discharge (ESD) through the latch.

It is additionally desirable to provide a latch with an easy open feature.

SUMMARY OF THE INVENTION

The objectives of the present invention are realized in a pawl-type, inject-eject latch having a rotatable, deformable wire bail mounting (without tools). This pawl inject-eject latch provides a low profile and narrow footprint configuration, and is essentially capable of being installed and removed without tools. The latch includes an elongate housing member which is installed into a cutout in the face of a panel or face of a drawer. Operating within the housing so as to be accessible from the face is an elongate pull handle which is connected to operate a pawl. This pull handle is spring biased to the open position whereof the spring action and rotation of the pull about one end thereof causes a release of the pawl. A button release frees the pull biasing spring to rotate the pull and operate the pawl.

A wire bail surrounds the housing, is carried thereon, and rotates from the pull pivot end of the housing during housing insertion and removal from a mating panel (face) cutout. This bail interlocks with portions of the housing to hold the latch housing securely in place against the face onto which it is mounted. The cutout in the face includes "bump-out" type cutouts to provide space for the wire bail to pass when the housing is inserted or removed. The bail is pivoted to extend at right angles (orthogonal) to the face during the removal and insertion of the latch thought the face cutout.

In its application, the inject-eject pawl latch is mounted to a first member, such as a closure panel for releasably retaining the closure panel against an enclosure. More specifically, this panel forms the face of a drawer-type module usually, including an electronic component carrying circuit board. The latch housing can receive a plurality of pins, wherein the handle and pawl members are mounted for rotational movement. The handle is substantially flush with the housing and is in contact with a button member in the closed position. The button releases the pull handle and results in a spring assisted activation of the opening of the pull handle and the disengagement of the pawl from its engagement with the enclosure. The movement of the handle, button member and pawl member are biased by a central torsion spring whose operation is permitted by the rotation of a release plate. This release plate's rotation is created by depressing the button. The materials are usually constructed of a metal material but some plastic parts can be used. The housing and appropriate components have s surface coating to reduce or eliminate EMI and ESD effects.

BRIEF DESCRIPTION OF THE DRAWINGS:

The features, advantages and operation of the present invention will become readily apparent from a reading of the following description in connection with the accompanying drawings, in which like numerals refer to like elements, and in which:

FIG. 55 is a perspective partial view assembly of the housing of the first embodiment latch with the first embodiment wire bail clamp partially inserted into the panel cutout;

FIG. 56 shows the assembly of FIG. 55 with the first latch housing and first wire bail fully inserted into the panel cutout;

FIG. 57 shows the inserted assembly of FIG. 56 with the wire bail rotated into the clamping position;

FIG. 58 is a perspective partial view assembly of the second embodiment of the wire bail clamp with its mating housing partially inserted into the panel cutout;

FIG. 59 shows the assembly of FIG. 58 with the mating housing and second embodiment wire bail fully inserted into the panel cutout; and FIG. 60 shows the inserted assembly of FIG. 59 with the second embodiment wire bail rotated into the clamping position with its mating housing.

DETAILED DESCRIPTION OF THE INVENTION

This present invention provides a pawl inject-eject latch assembly with a quick release mounting clamp. The latch pawl movement is spring assisted to perform panel or drawer inject and eject operation which in turn performs associated electrical connector inject and eject movement. The latch assembly has a low profile flush mounting and is intended for use for retaining electronics and/or opto-electronics modules in larger enclosures. These modules typically take the form of printed circuit boards mounted to a metal face plate or panel member or may take the form of a metal drawer or tray which carries electronics, power transmission components, switch gear, routing circuitry, or other electrical and electronic units. The modules each commonly slide into the larger enclosure guided by card guides, ball slides, or some other form of linear guide. In all cases there is an electrical or electronic signal connector on the back of the printed circuit board or tray, which engages a complementary (mating) connector mounted inside the larger enclosure (usually the backplane). The present latch may be used in pairs for each drawer or panel plate, with each latch aligning with the linear guides on each side of a module.

The latch mounts to the panel (face plate of a drawer) with its pawl capable of engaging the exposed edge of the larger enclosure opening for the drawer. The user (operator) would operate a pair of latches simultaneously to open a drawer and minimize any possible damage to the rear mounted connector.

The pawl inject-eject latch of the present invention thereby has the ability of injecting the module, of ejecting the module, and of retaining the module even through a severe jarring, as in a seismic event. The latch is coated for EMI (electromagnetic interference) shielding and for grounding to prevent ESD (electrostatic discharge) through the latch.

Figure 1:
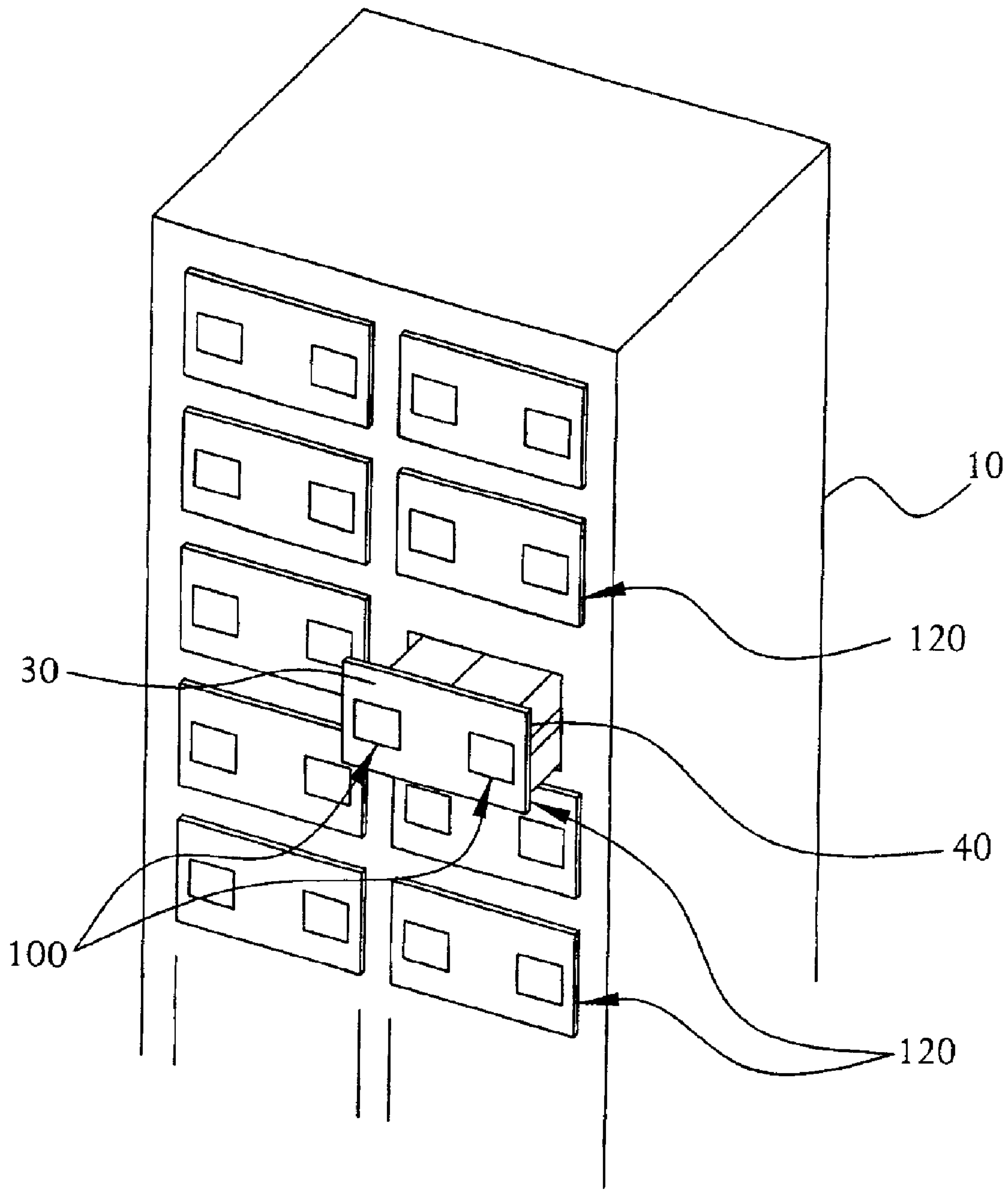
FIG. 1 is perspective view of an enclosure illustrating the relationship of the module, latches and linear guide.

FIG. 1 shows an enclosure 10 wherein a plurality of modules 20 are stored. These modules 20 are each a printed circuit board mounted to a face plate or panel 30. The modules 20 slide into the enclosure 10 by means of a linear guide 40. The latch 100 is installed, usually in pairs, within the panel 30 and are aligned inside of the linear guides 40.

Figure 2:
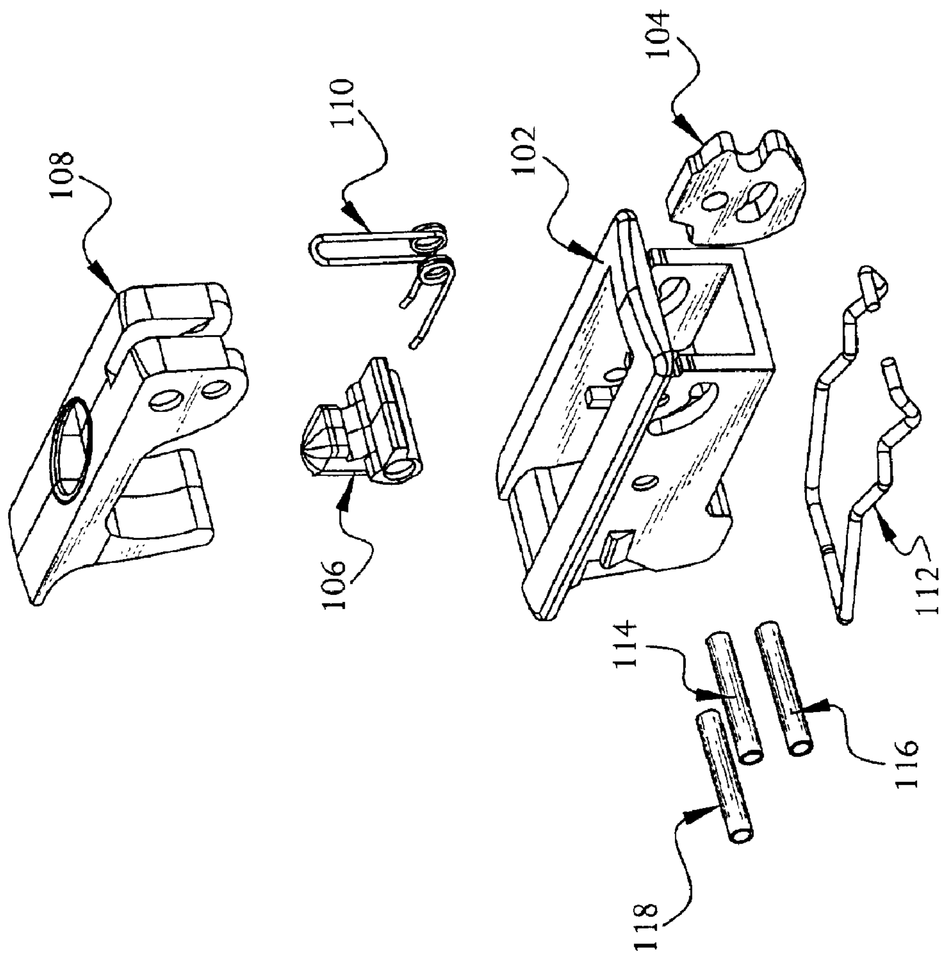
FIG. 2 is an exploded view of the preferred embodiment of the latch of the present invention.
Figure 3:
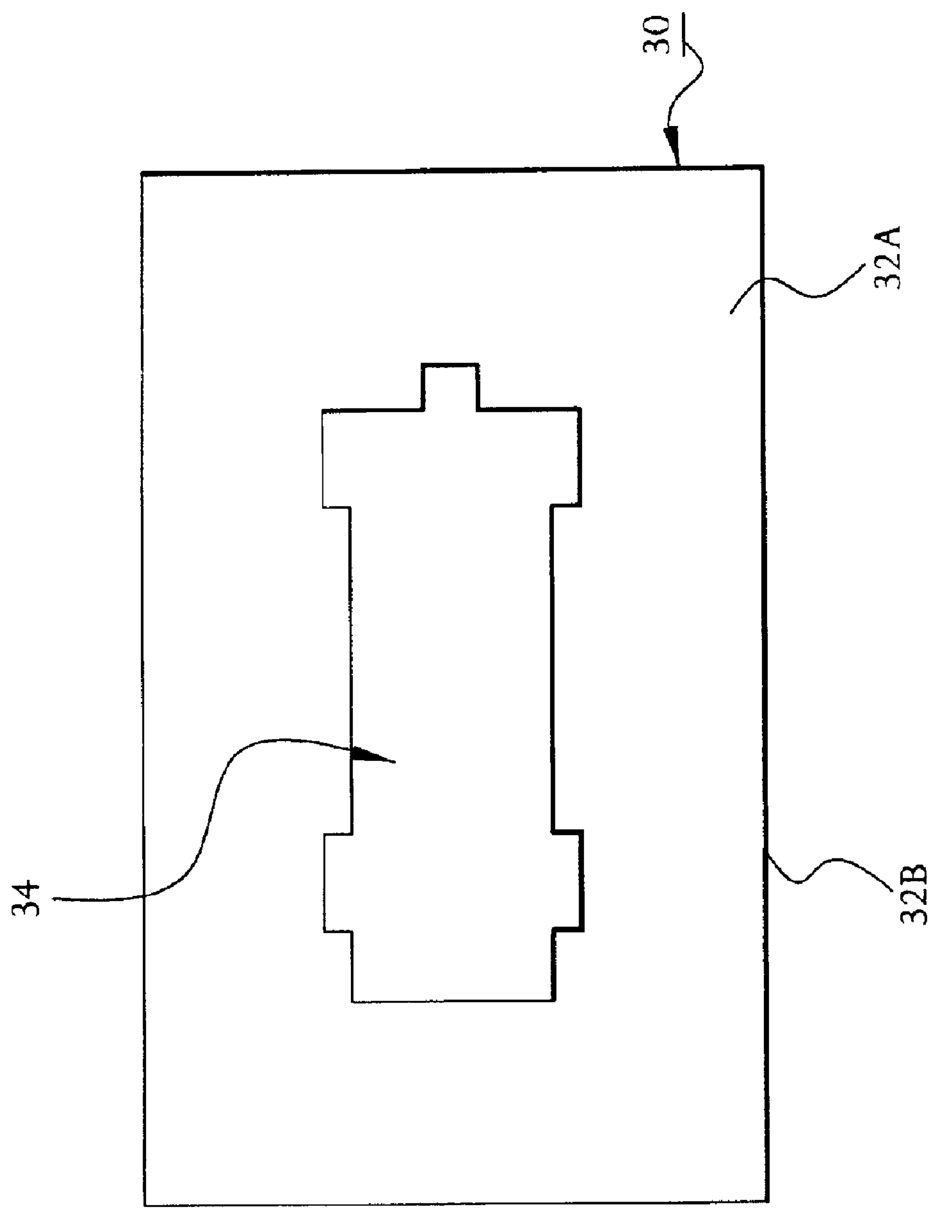
FIG. 3 is a frontal view of panel and housing receiving cutout for the preferred embodiment of this latch.

In FIGS. 2 and 3 the preferred embodiment of the latch is shown prior to installation having individual elements including a housing 102, a pawl member 104, a button member 106, a handle 108, a torsion spring 110, a clamp 112 and pin members 114, 116 and 118. The prepared panel 30 is shown having a top side 32A and bottom side 32B.

Figures 4, 4A, 4B, 4C, 4D, 4E:
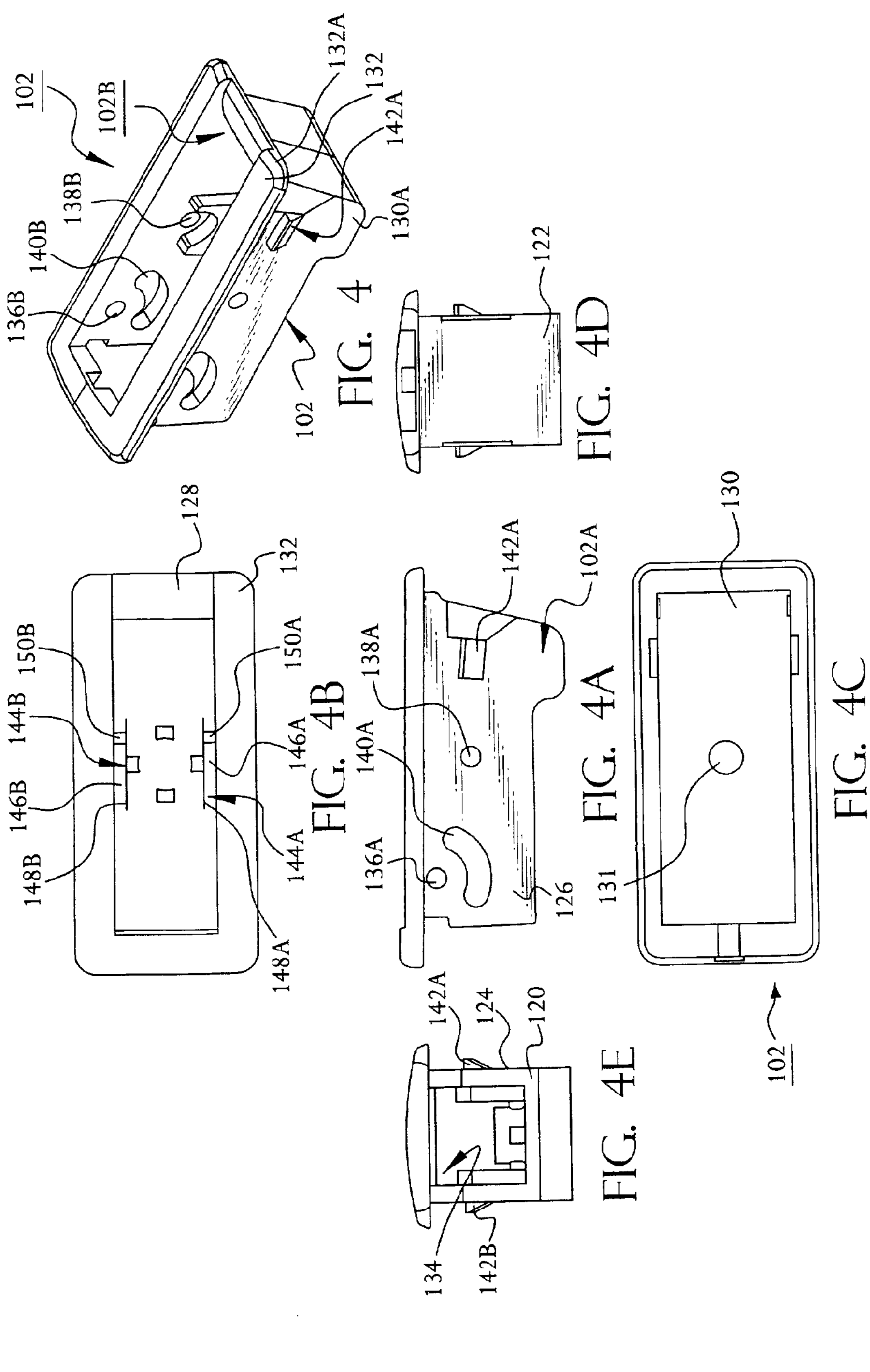
FIG. 4 is a perspective view of the housing of the preferred embodiment of the latch.
FIG. 4A is a left side view of the housing of this first embodiment of the latch.
FIG. 4B is a top view the housing of the latch of FIG. 4.
FIG. 4C is a bottom view the housing of the latch of FIG. 4.
FIG. 4D is a rear view the housing of the latch of FIG. 4.
FIG. 4E is a front view the housing of the latch of FIG. 4.

FIGS. 4 through 4E show the housing 102 having a front side 120, back side 122, right side 124, left side 126, top portion 128, bottom portion 130 and a flange 132. A ledge 132A is located under the flange 132 so as to provide conductivity between the housing 102 and the panel 30 to prevent EMI and ESD. The housing 102 has a recessed area 130A on the bottom side 130 for storage of the handle 108. The front side 120 has an aperture 134 which allows for the positioning of the pawl member 104 when the latch 100 is assembled. The right side 124 and left side 126 of the housing 102 have corresponding aperture pairs forward 136A, 136B, central 138A, 138B and longitudinal 140A, 140B which allow for the movement of the clamp 112, pawl member 104, button member 106 and handle 102, as discussed further below. The exterior of the housing 102A has corresponding ramped elements 142A, 142B on the right side 124 and left side 126, respectively, which lock the clamp 112 to secure the latch 100 to the panel 30. The interior of the housing 102B has button member mounts 144A, 144B having a rounded central area 146A, 146B between a substantially horizontal forward stop 148A, 148B and rear stop 150A, 150B. Undercuts 151A, 151B are located on the front side 120 below the flange 132 for securing the housing 102 to the panel 30.

Figures 5, 5A, 5B, 5C, 5D, 5E:
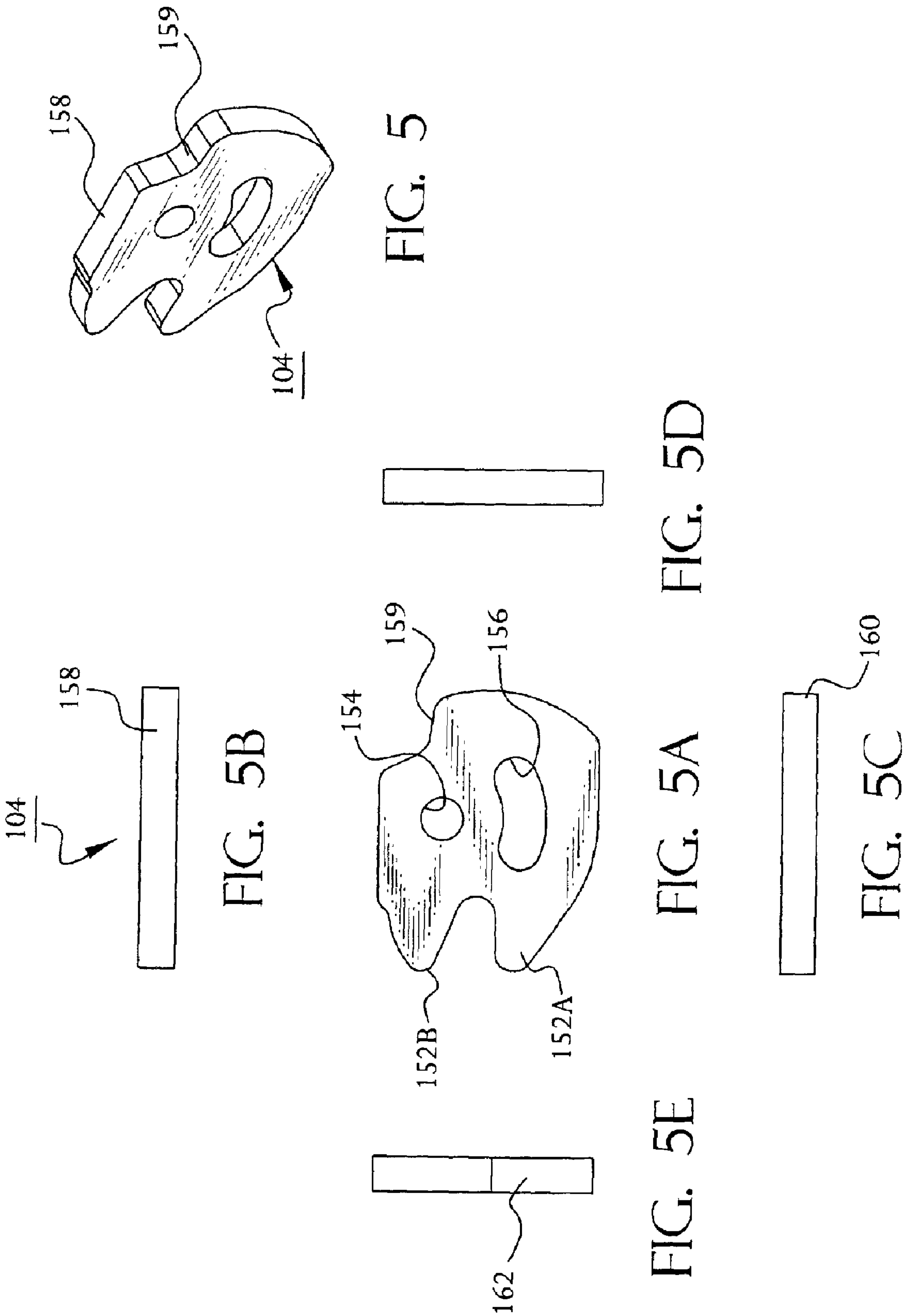
FIG. 5 is a perspective view of the pawl member of the first embodiment of the latch of the present invention.
FIG. 5A is a side view of the pawl member of the latch of FIG. 5.
FIG. 5B is a top view of the pawl member of the latch of FIG. 5.
FIG. 5C is a bottom view of the pawl member of the latch of FIG. 5.
FIG. 5D is a rear view of the pawl member of the latch of FIG. 5.
FIG. 5E is a front view of the pawl member of the latch of FIG. 5.

Referring to FIGS. 5 through 5E, the pawl member 104 is shown having a double pawl front portion comprising a primary 152A and secondary 152B finger. The central aperture 154 and longitudinal aperture 156 align with the forward aperture 136A, 136B and longitudinal aperture 140A, 140B of the housing 102. The top portion 158 has an indented section 159 which permits the handle 108 to lay flush when in the closed position and to avoid contact during activation. The top portion 158 and bottom portion 160 are parallel to each other and substantially perpendicular to a rear portion 162.

Figure 6:
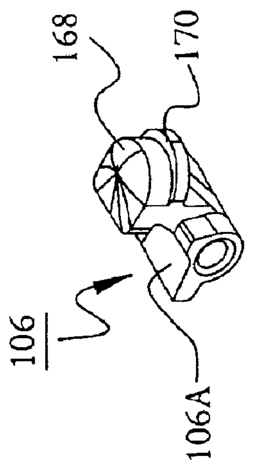
FIG. 6 is a perspective view of the button member of the first embodiment of the latch of the present invention.
Figure 6D:
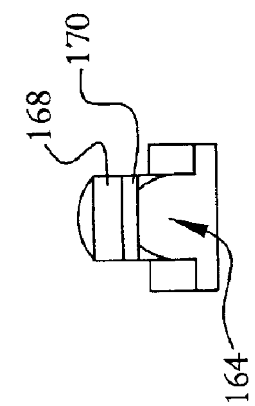
FIG. 6D is a rear view of the button member of FIG. 6.
Figure 6B:
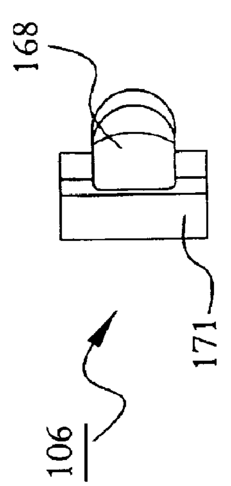
FIG. 6B is a top view of the button member of FIG. 6.
Figure 6A:
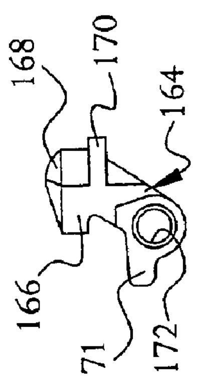
FIG. 6A is a left side view of the button member of FIG. 6.
Figure 6C:
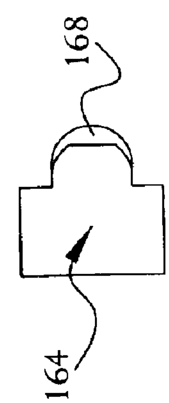
FIG. 6C is a bottom view of the button member of FIG. 6.
Figure 6E:
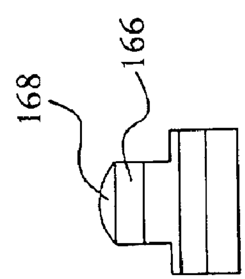
FIG. 6E is a front view of the button member of FIG. 6.

In FIGS. 6 through 6E, the button member 106 is shown having a body portion 164. A raised central activation portion 168 with a lip member 166 extending forward and a rearward cam member 170 extend radial from the body portion 164. A forward cam member 171 extends from the central body portion 164. Rotational movement of the button member 106 is limited by the contact of the forward cam member 171 with the forward stop member 148A, 148B of the housing 102. The rear cam member fills any gap made between the handle 108 and button member 106 to negate the possibility of any foreign matter falling into the housing 102. An aperture 172 extending through the body portion 164 aligns with the central aperture 138A and 138B of the housing 102.

Figure 7:
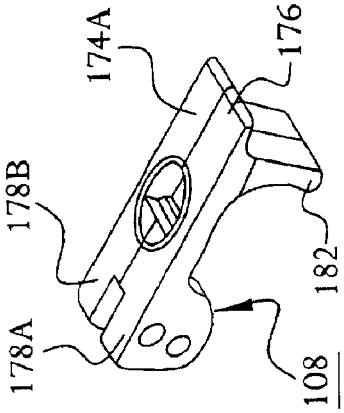
FIG. 7 is a perspective view of the handle of the first embodiment of the latch of the present invention.
Figure 7D:
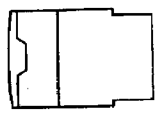
FIG. 7D is a rear view of the handle of FIG. 7.
Figure 7B:
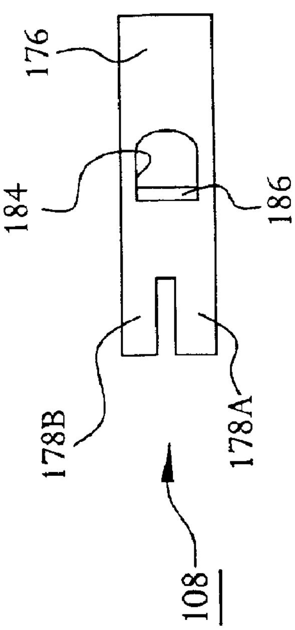
FIG. 7B is a top view of the handle of FIG. 7.
Figure 7A:
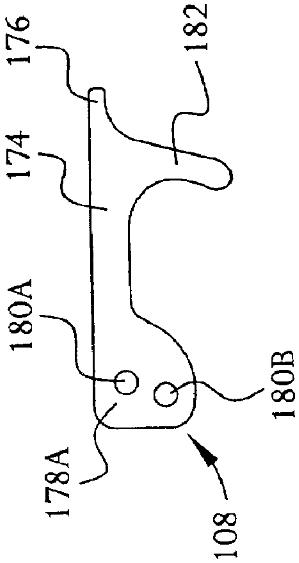
FIG. 7A is a left side view of the handle of FIG. 7.
Figure 7C:
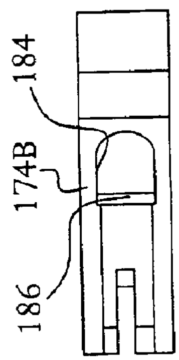
FIG. 7C is a bottom view of the handle of FIG. 7.
Figure 7E:
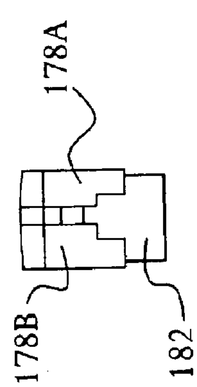
FIG. 7E is a front view of the handle of FIG. 7.

FIGS. 7 through 7E show the handle member 108 comprises a central body portion174 having a flush top surface 174A and a ramped bottom surface 174B which contours the shape of the torsion spring 110. The most posterior section 176 of the central body portion is tapered to be flush with the housing 102. In addition, the posterior section 176 acts as a tab member for further ease of use by the user (operator0. The central body portion 174 is continuous with forward body section 178 which is forked at its internal midsection wherein the pawl member 104 aligns. The exterior portions of the forward body portion form a pair of surfaces 178A, 178B. Each surface of the exterior portion 178A, 178B of the forward body portion 178 have a top aperture 180A, 181A and bottom aperture 180B, 181B vertically arranged therein. The top apertures 180A, 181A are aligned with the forward housing apertures 136A and 136B and the pawl aperture 154 and the bottom aperture 180B, 181B is aligned with the longitudinal apertures 140A, 140B, 156 of the housing 102 and of the pawl member 104. A rear body section 182 extends from the top portion 174 and is tapered for grasping by the operator finger during activation (discussed below). The central body portion 174 is interrupted midway by an aperture 184 which allows the access to the button member 106. The bottom surface 174A of the body portion 174 extends into the aperture 184 so as to form a lip portion 186.

Figures 8, 8A, 8B, 8C, 8D, 8E:
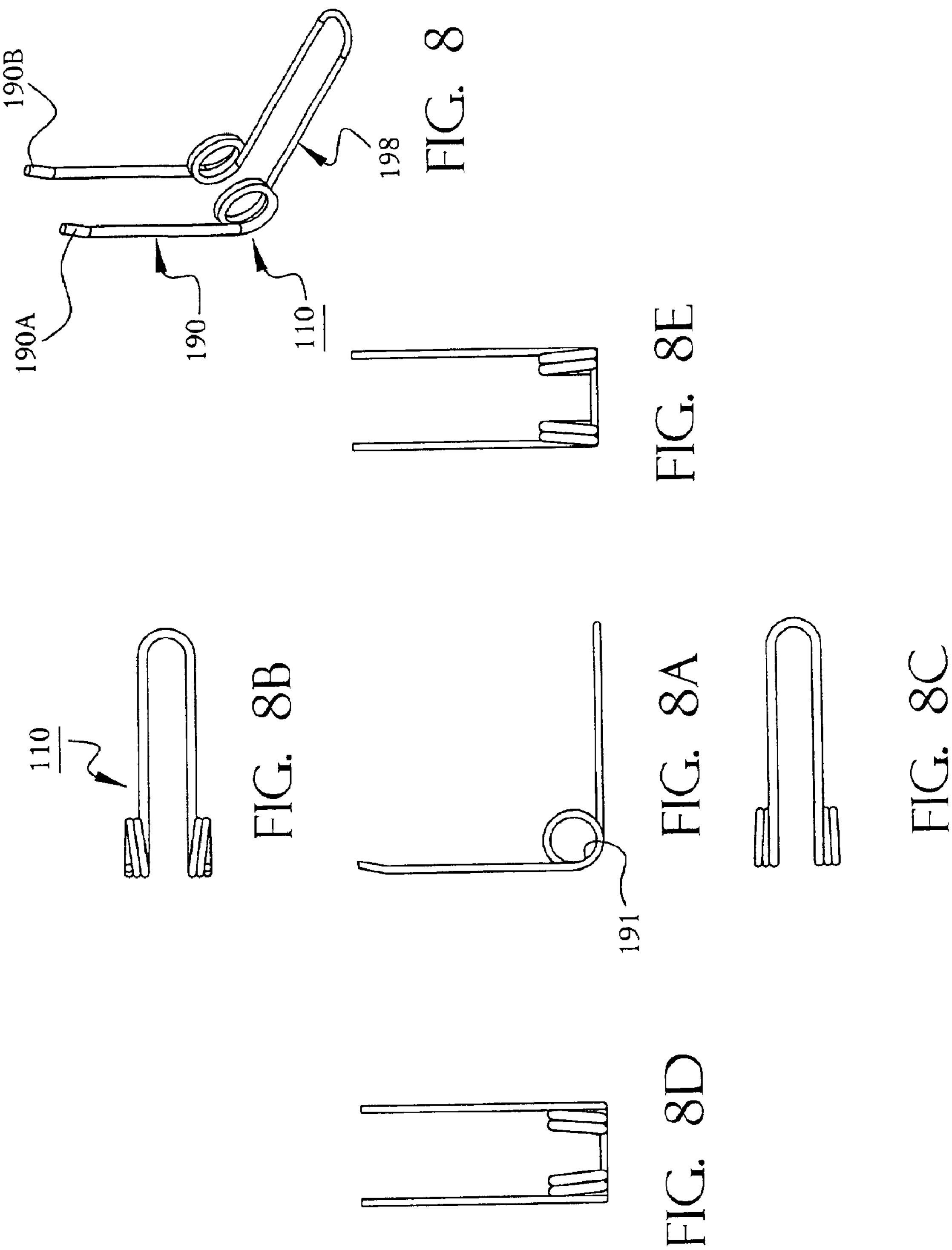
FIG. 8 is a perspective view of the torsion spring of the first embodiment of the latch of the present invention.
FIG. 8A is a side view of the torsion spring of FIG. 8.
FIG. 8B is a top view of the torsion spring of FIG. 8.
FIG. 8C is a bottom view of the torsion spring of FIG. 8.
FIG. 8D is a rear view of the torsion spring of FIG. 8.
FIG. 8E is a front view of the torsion spring of FIG. 8.

In FIGS. 8 through 8E, the torsion spring 110 is shown having a closed curved end 188 and an open end 190 with contact points 190A, 190B. The coiled section 191 is traversed by the forward pin member 114, so as to avoid movement and reduce contact with other elements of the latch 100.

Figure 9:
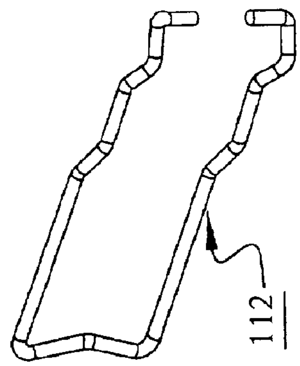
FIG. 9 is a perspective view of a first embodiment of the clamp of the first embodiment of the latch of the present invention.
Figure 9E:
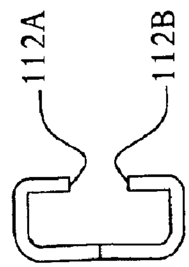
FIG. 9E is a front view of the clamp of FIG. 9.
Figure 9B:
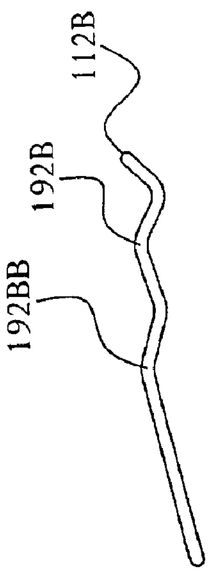
FIG. 9B is a top view of the clamp of FIG. 9.
Figure 9A:
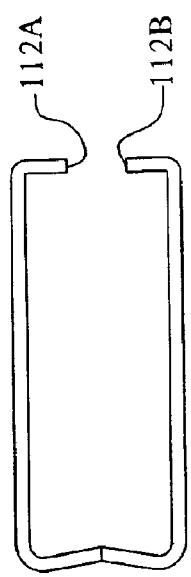
FIG. 9A is a side view of the first embodiment of the wire bail clamp of FIG. 9.
Figure 9C:
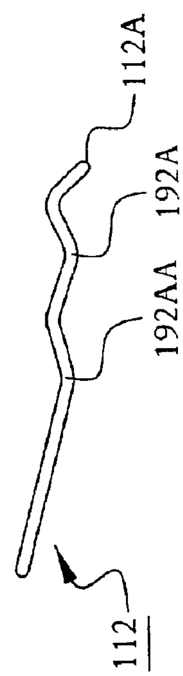
FIG. 9C is a bottom view of the clamp of FIG. 9.
Figure 9D:
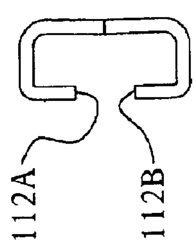
FIG. 9D is a rear view of the clamp of FIG. 9.

Referring to FIGS. 9 through 9E, the clamp 112 is shown having attachment rotation ends 112A, 112B. Contact points 192A, 192AA, 192B, 192BB are evenly distributed on each side of the wire bail clamp 112.

Figure 10:
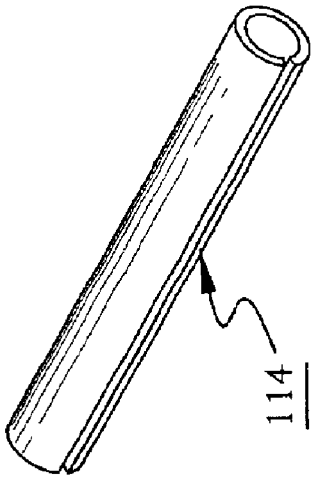
FIG. 10 is a perspective view of the pin members of the first embodiment of the latch of the present invention.
Figure 10D:
FIG. 10D is a rear view of the pin members of FIG. 10.
Figure 10B:
FIG. 10B is a top view of the pin members of FIG. 10.
Figure 10A:
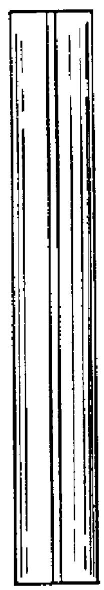
FIG. 10A is a side view of the pin members of FIG. 10.
Figure 10C:
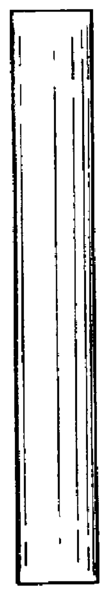
FIG. 10C is a bottom view of the pin members of FIG. 10.
Figure 10E:
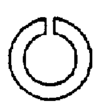
FIG. 10E is a front view of the pin members of FIG. 10.

In FIGS. 10 through 10E, a pin member 114 is illustrated which is identical to the other pin members 116, 118 used in the invention. The pin members are distributed in the forward 114, lower 116 and centrally 118. The forward pin member 114 is used for rotation of the pawl member 104 and handle 108 and traverses the forward aperture 136A, 136B. The lower pin member is used for "horizontal" movement of the pawl member 104 and handle 108 and traverses the longitudinal aperture 140A, 140B of the housing 102. The central pin member 118 is used for rotational movement of the button member 106 and traverses the central aperture 138A, 138B of the housing 102.

Figure 11:
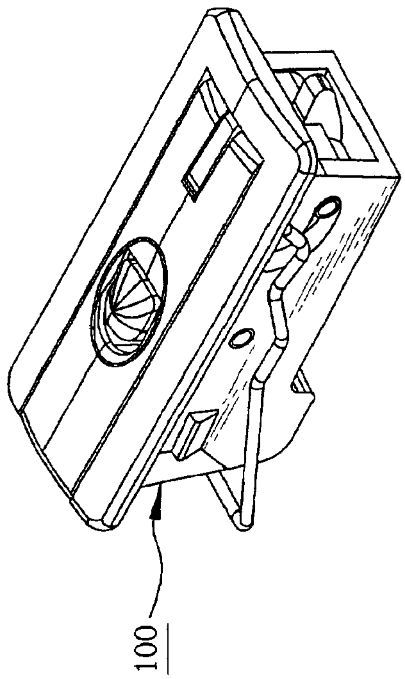
FIG. 11 is a perspective view of the fully assembled latch of the first embodiment of the present invention including the first embodiment of the wire bail clamp.
Figure 11E:
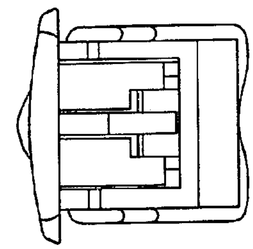
FIG. 11E is a front view of the full assembly of FIG. 11.
Figure 11B:
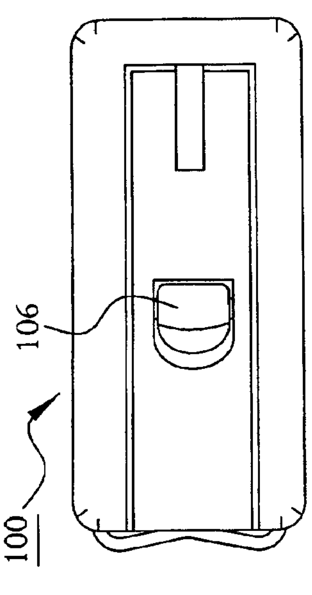
FIG. 11B is a top view of the full assembly of FIG. 11.
Figure 11A:
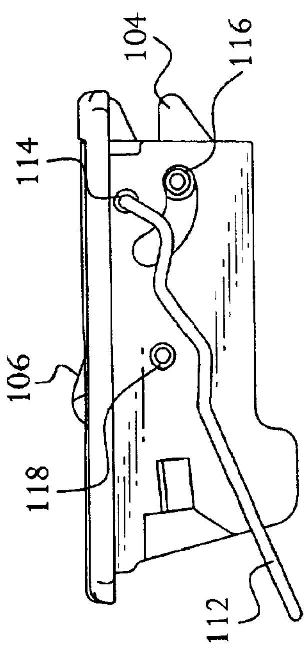
FIG. 11A is a side view of the full assembly of FIG. 11.
Figure 11C:
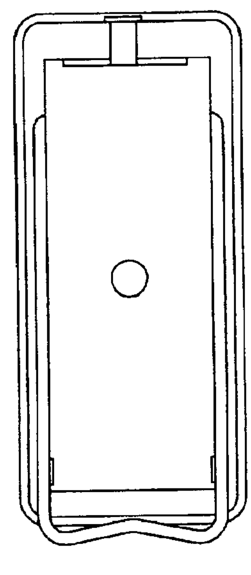
FIG. 11C is a bottom view of the full assembly of FIG. 11.
Figure 11D:
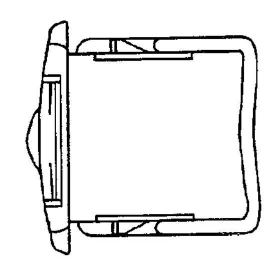
FIG. 11D is a rear view of the full assembly of FIG. 11.

Referring now to FIGS. 11 through 11E, the fully assembled latch 100 is substantially flush on the top wherein only the button member 106 is slightly raised.

Figure 12:
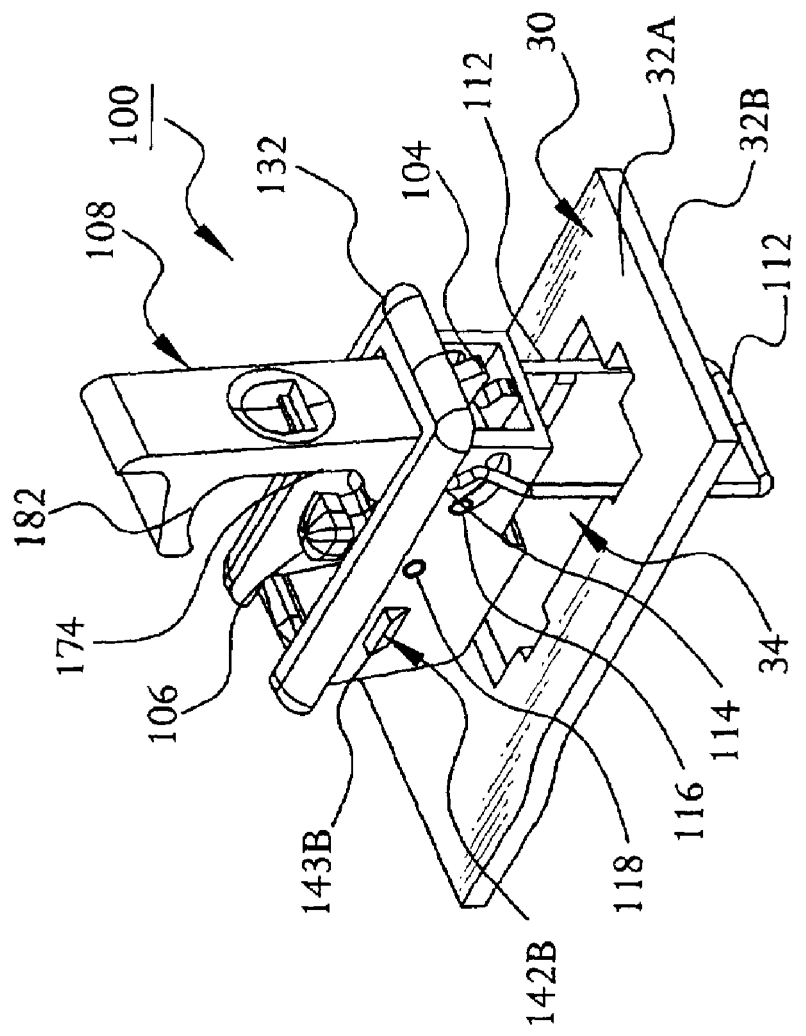
FIG. 12 is a perspective view of the first embodiment full assembly illustrating the partial insertion into a prepared panel face.
Figure 13:
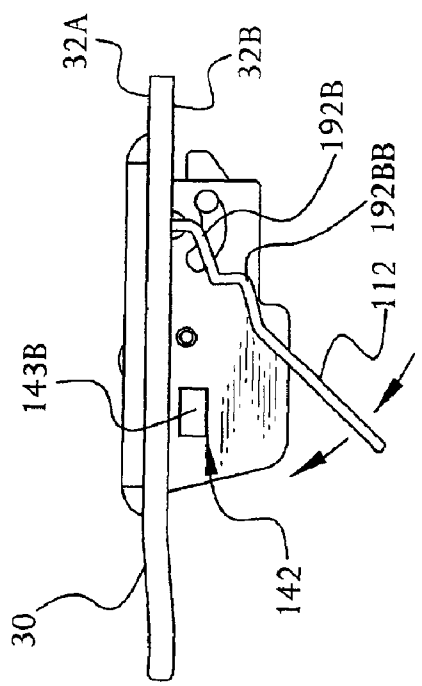
FIG. 13 is a right side view of the first embodiment full assembly illustrating the movement into clamping position of the clamp.
Figure 13A:
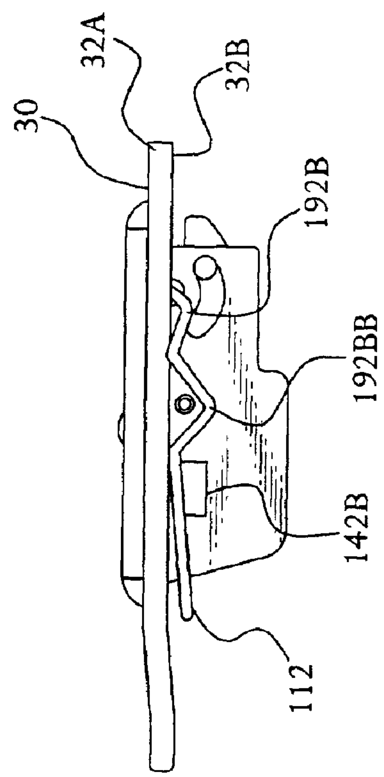
FIG. 13A is a right side view of the full assembly of FIG. 13 showing the clamp in the installed locking position.
Figure 14:
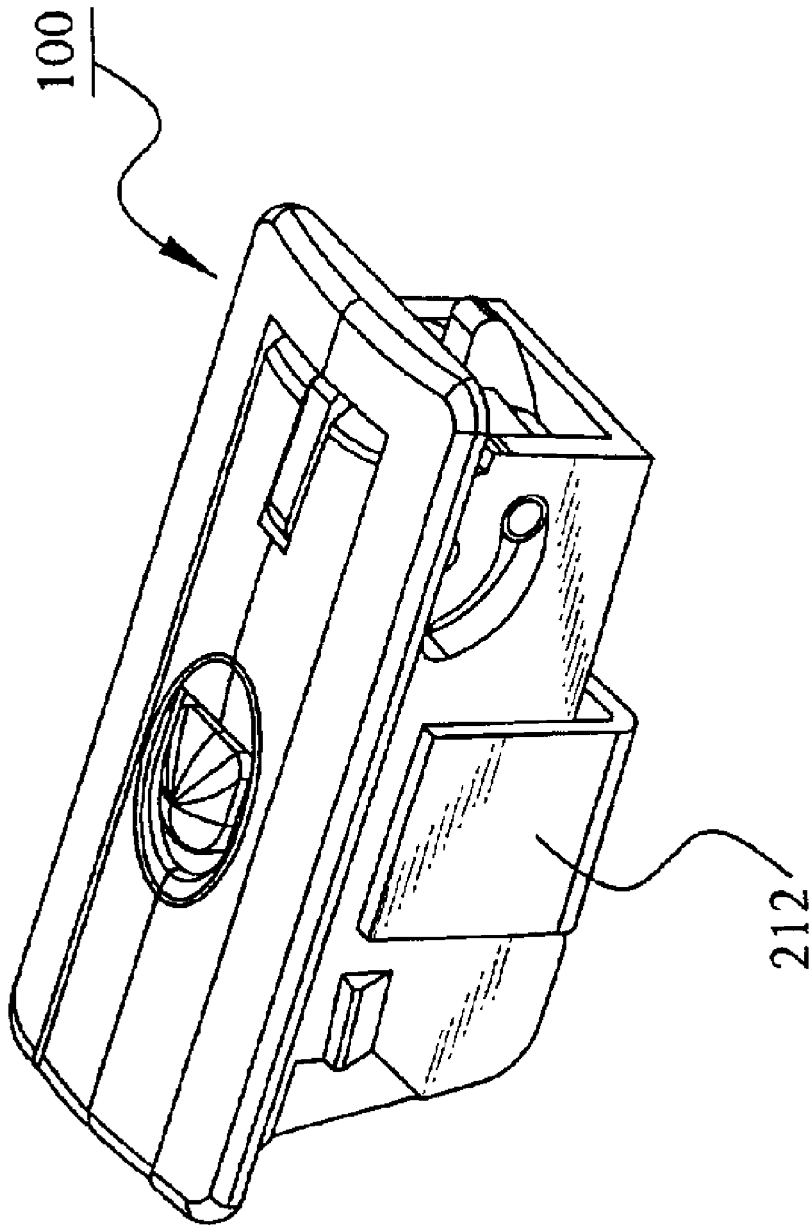
FIG. 14 is a perspective assembly view of the latch and a second embodiment of a cradle mounting attachment being an alternative to the first wire bail clamp.
Figure 15:
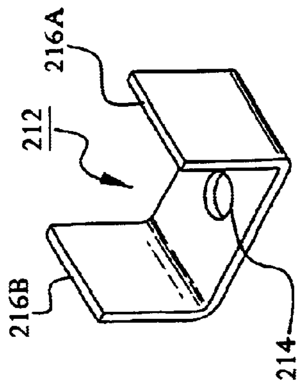
FIG. 15 is a perspective view of the second embodiment cradle mounting attachment structure.
Figure 15D:
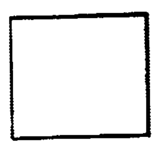
FIG. 15D is a rear view of the cradle mounting of FIG. 15.
Figure 15B:
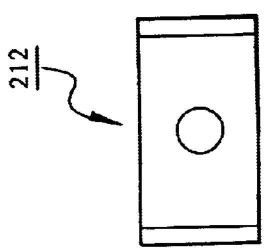
FIG. 15B is a top view of the cradle mounting of FIG. 15.
Figure 15A:
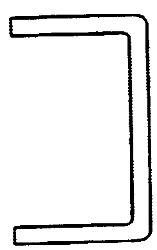
FIG. 15A is a side view of the cradle mounting of FIG. 15.
Figure 15C:
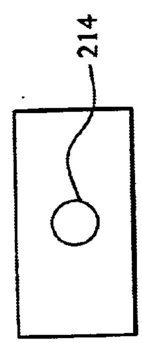
FIG. 15C is a bottom view of the cradle mounting of FIG. 15.
Figure 15E:
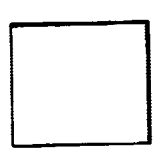
FIG. 15E is a front view of the cradle mounting of FIG. 15.

In FIGS. 12, 13, and 13A, installation of the preferred embodiment of the latch 100 to the panel 30 is illustrated using the multiple point clamp 112. The ends 112A, 112B of the clamp 112 fit loosely inside the ends of the forward pin 114 which acts as a fulcrum for the handle 108 and pawl member 104. This allows the clamp 112 to rotate about the forward pin 114.

Mounting of the latch 100 in the panel 30 is accomplished by guiding the latch 100 through the cutout 34 in the panel 30. The cutout 34 is notched in five places to provide clearance for the clamp 112, ramps 142A, 142B and pawl 104. These notches are bump-outs of the opening created by the cutout 34.

As the latch 100 passes through the panel 30, the wire bail-type clamp 112 is rotated so as to straddle the latch housing 102. The forward most two contact points of the clamp 192A, 192B will bear against the bottom side of the panel 32B pulling the latch housing 102 tight against the panel 30. Rotating the bail clamp 112 still further rides the clamp 112 up and over the tapered projecting shoulders or projecting ramps 142A, 142B, one on each side of the housing 102, thus slightly expanding or spreading the side legs of the bail clamp 112 to ride over the ramps 142A, 142B, and then rest on the flat abutment portion 143A, 143B of each respective ramp 142A, 142B. The bail 112 is therefore trapped and the housing 102 is fixed into locked position against the panel bottom side 32B.

Figure 16:
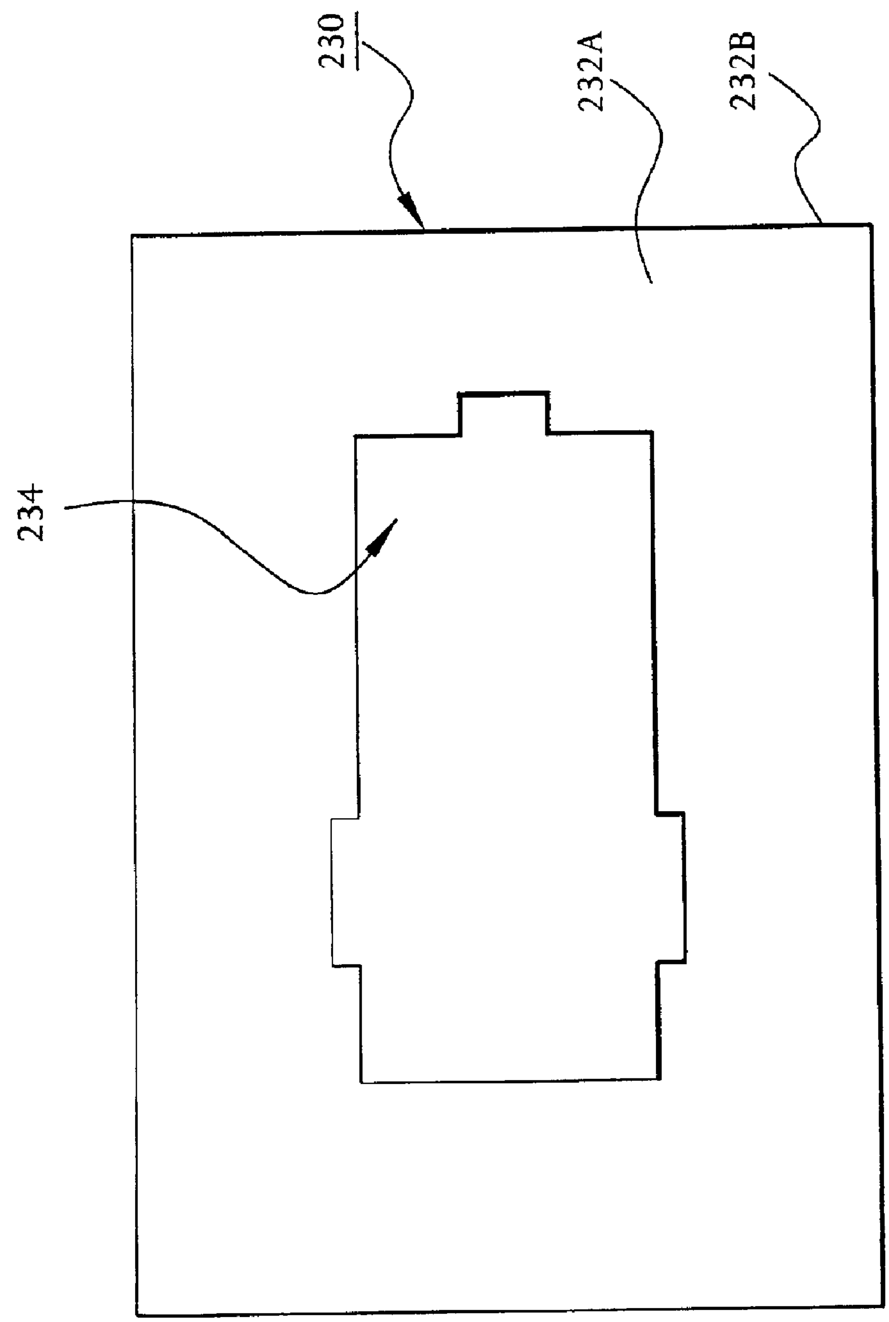
FIG. 16 is a top view of a panel face prepared cutout opening for the assembly of the latch and cradle mounting attachment.

Simultaneously, the remainder of the contact points 192AA, 192BB are secured against the bottom of the panel 32B. The multiple contact points of the clamp 192A, 192AA, 192B, 192BB are used to distribute tension load. In FIGS. 14, 15, 15A through 15E, and 16, a second embodiment of the mounting is illustrated, wherein a cradle-type bracket 212 is attached to the housing 102 by any of a variety of attachment means, including self-tapping screws. The attachment screw extends through an aperture 214 in the cradle bracket 212 and a receiving hole in the housing 131. A prepared panel 230 is shown in FIG. 16 to accommodate the bracket 212. The bracket ends 216A, 216B contact the bottom side of the panel 232B, wherein the panel 230 is held in place by the bracket 212, ramps 142A, 142B and the undercuts 151A, 151B. The cutout 234 has 3 notches 234A, 234B and 234C, with the first to on opposite sides and the third at one end.

Figure 17:
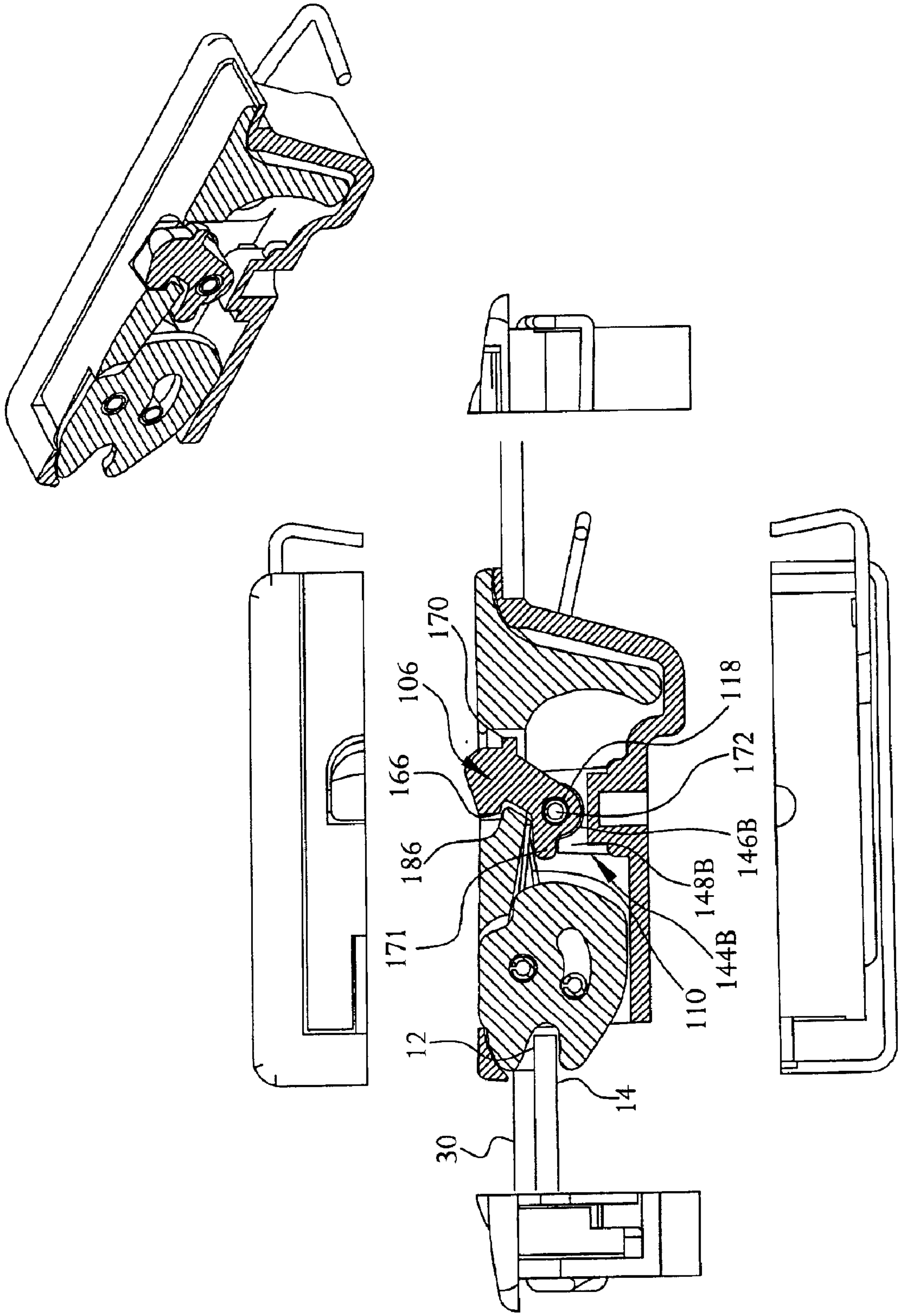
FIG. 17 is a cross-sectional exploded view of the assembly of the first embodiment of the latch and the first embodiment of the wire bail clamp with the latch handle in the closed position.
Figure 18:
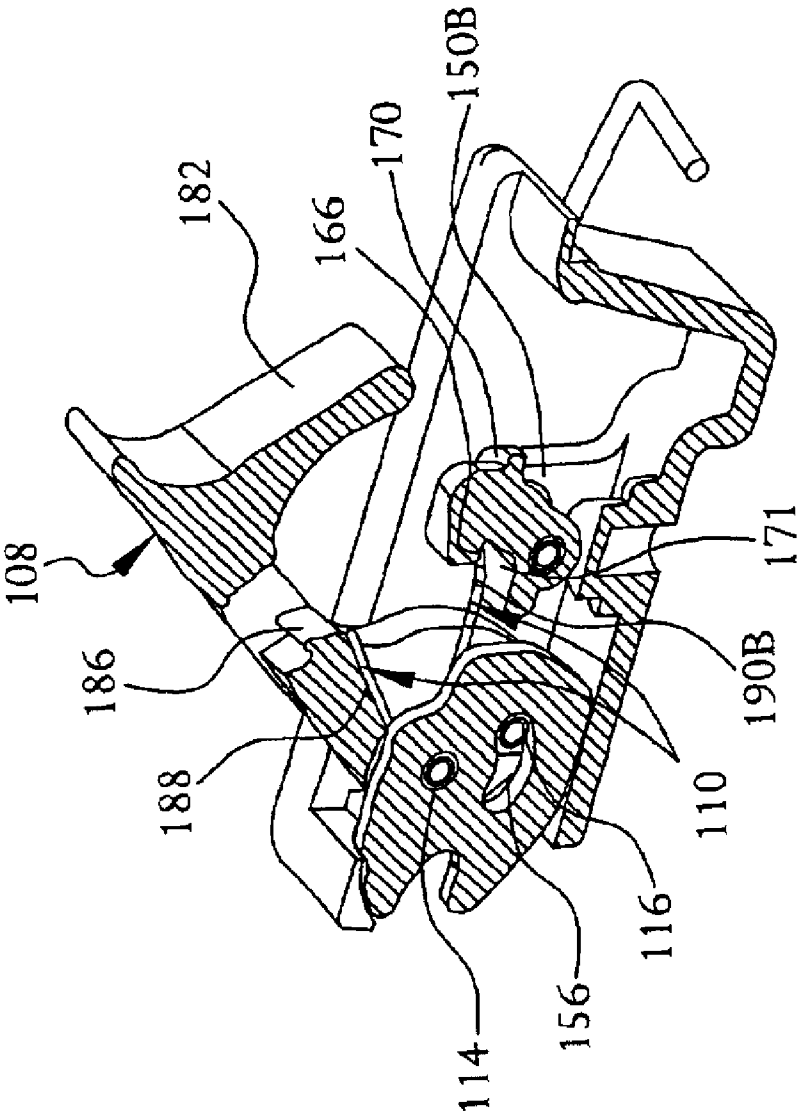
FIG. 18 is a cross-sectional perspective view of the assembly of FIG. 17 with the latch handle in the half-open position and the pawl engaged prior to ejection.
Figure 19:
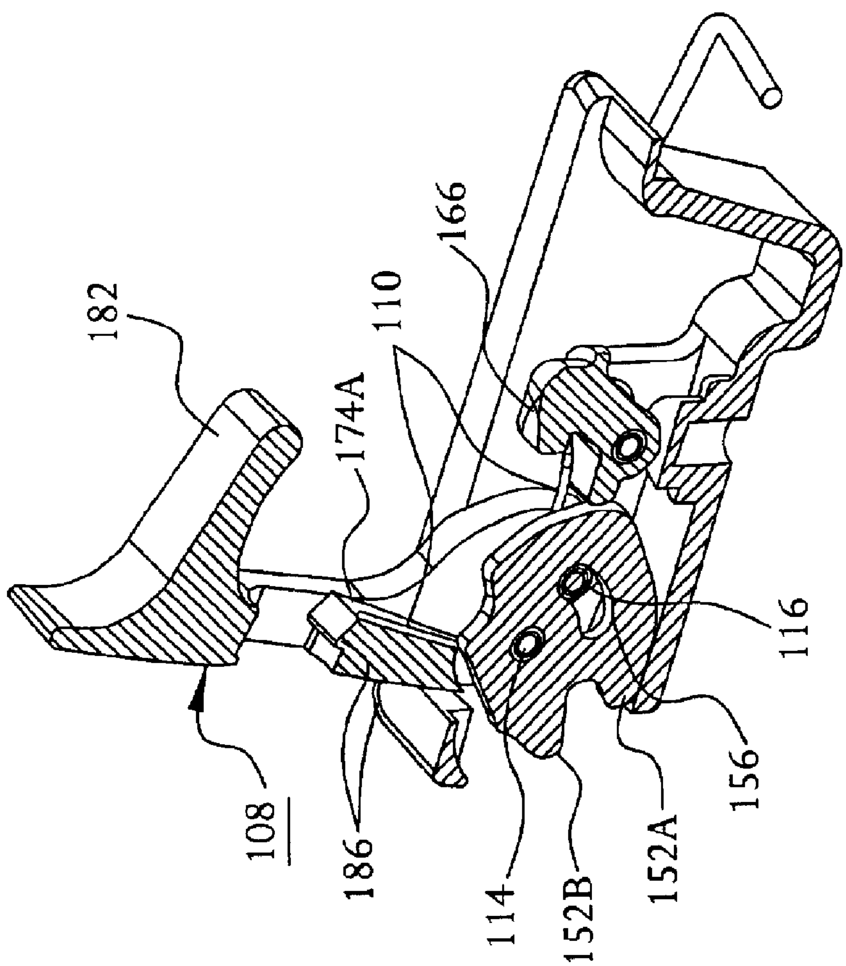
FIG. 19 is a cross-sectional perspective view of the assembly of FIG. 17 with the latch handle in the fully-opened position and the pawl disengaged after ejection.
Figure 20:
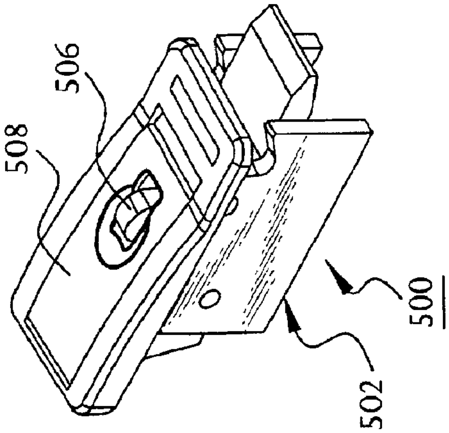
FIG. 20 is a perspective view of a second embodiment of the latch of the present invention fully assembled in the closed position.
Figure 20E:
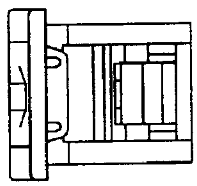
FIG. 20E is a front view the second embodiment of the latch of FIG. 20.
Figure 20B:
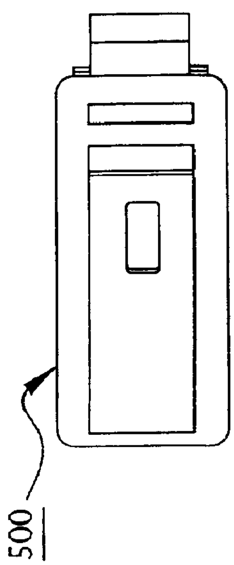
FIG. 20B is a top view of the second embodiment of the latch of FIG. 20.
Figure 20A:
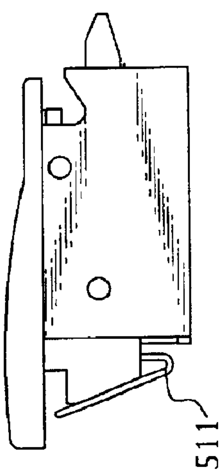
FIG. 20A is a right side view of the second embodiment of the latch of FIG. 20.
Figure 20C:
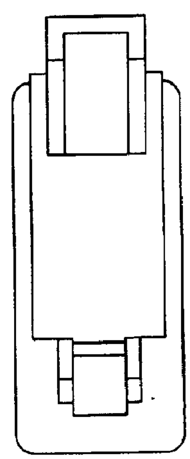
FIG. 20C is a bottom view of the second embodiment of the latch of FIG. 20.
Figure 20D:
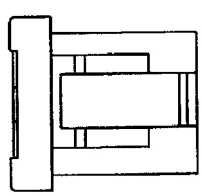
FIG. 20D is a rear view of the second embodiment of the latch of FIG. 20.
Figure 21I:
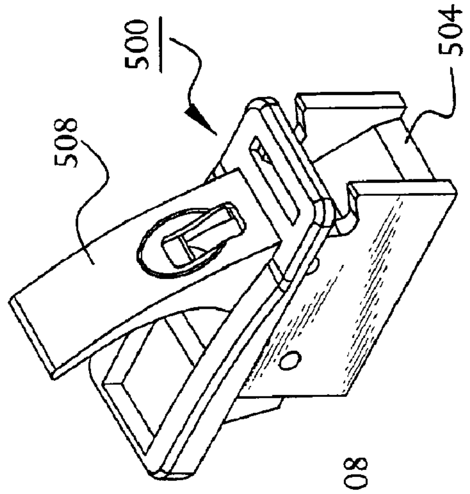
FIG. 21 is a perspective view of the second embodiment of the latch in the open position.
FIG. 21A is a right side view of the second embodiment of the latch of FIG. 21.
FIG. 21B is a top view of the second embodiment of the latch of FIG. 21.
FIG. 21C is a bottom view of the second embodiment of the latch of FIG. 21.
FIG. 21D is a rear view of the second embodiment of the latch of FIG. 21.
FIG. 21E is a front view the second embodiment of the latch of FIG. 21.
Figure 21E:
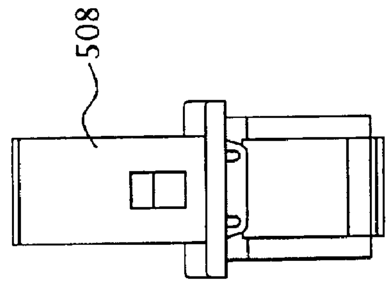
Figure 21B:
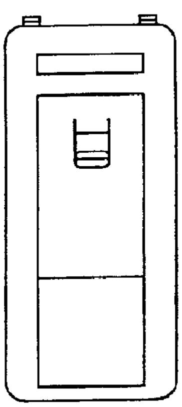
Figure 21A:
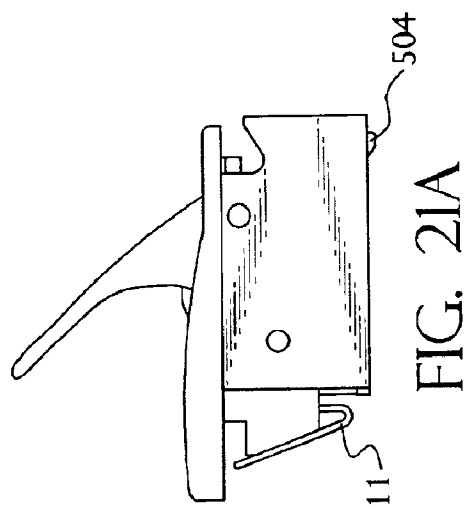
Figure 21C:
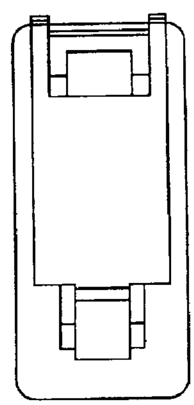
Figure 21D:
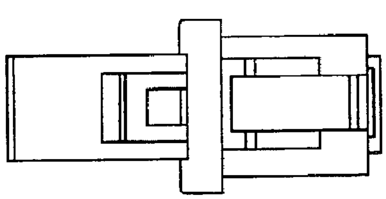
Figure 22:
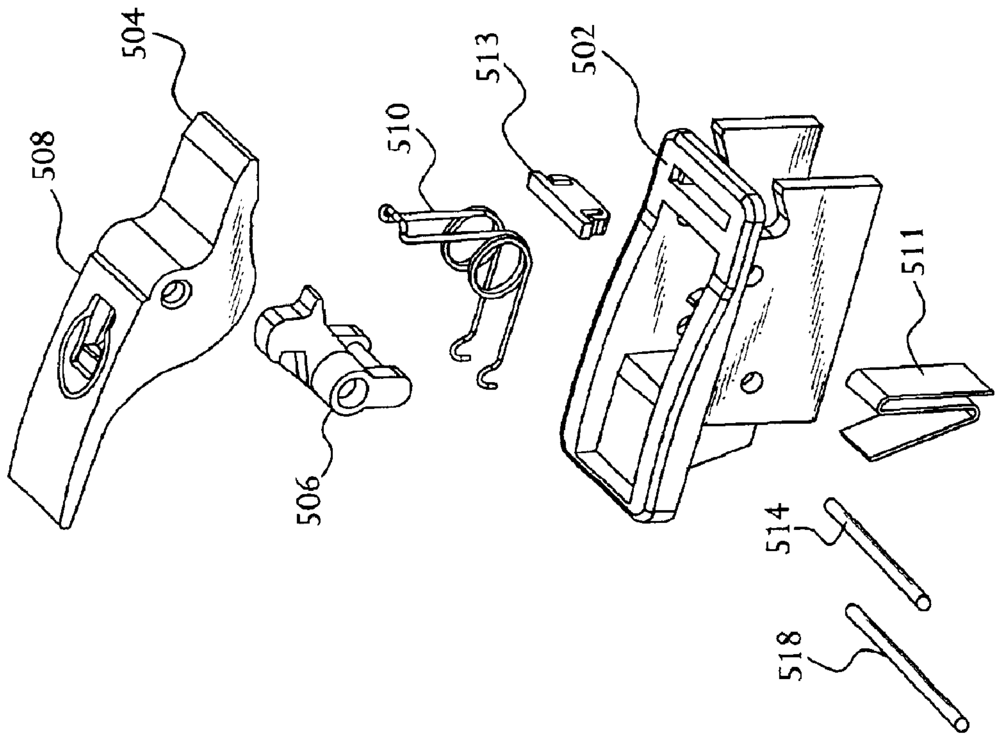
FIG. 22 is an exploded view of the elements of the second embodiment of the latch.

In FIGS. 17 through 19, the activation of the latch 100 and ejection of the module 20 is accomplished by pushing the button member 106 rearward wherein it rotates downwardly around the central pin member 118 which traverses the button aperture 172 and central housing apertures 138A, 138B. As the button 106 is moved rearward its pivotal connection also forces it downward. Specifically, the button member 106 rotates on the rounded central portion 146A, 146B of the button mounts 144A, 144B, which disengages the lip portion 106A of the button 106 from the lip portion 186 of the pull handle 108. Rotation is limited by contact of the forward cam member 171 of the button member 106 with the forward stop 148A, 148B of the housing 102. This action is biased by the torsion spring 110, which contacts the forward cam member 171 with ends 190A, 190B of the open side 190.

In FIG. 18, the pull handle 108 moves to a first position driven by contact on its bottom surface 174A with closed end the torsion spring 188. The movement to the first position is limited to the distance the lower pin member 116 which traverses the longitudinal pawl member aperture 156, bottom handle aperture 180B, 181B and longitudinal housing aperture 140A, 140B is permitted to move horizontally. The handle 108 in the first position allows the user (operator) finger to grasp rear body portion 182 of the pull handle 108.

Further rotation of the handle 108 beyond that of the first position, requires the operator to forcibly move the handle 108 through its intended range of motion. This rotational movement of the handle 108 around the forward pin member 114 drives the pawl member 104 rearward disengaging the enclosure 10. As this motion retracts the pawl member 104 rearward, the secondary finger 152B of the pawl member 104 bears against the enclosure face 12 to force the latch 100 and module 20 out of the enclosure 10 enough to disengage the electrical components at the back of the module 20. The rear handle area 182 of the pull handle 108 can be used to pull the module 20 out of the enclosure 10.

To insert a module 20 into the enclosure 10, the operator pushes the panel 30 sliding the module 20 into the enclosure

10 until the secondary finger 152B of the pawl 104 on each latch comes to rest against the from face of the enclosure 12. This movement does not affect the pawl member 104 because the lower pin member 116 in the longitudinal apertures 140A, 140B, 156 of the pawl 104 and housing 102 are free to move within the longitudinal aperture. The operator then pushes the handle 108 of the latch 100 back into their housing 102 until the lip of the button member 166 snaps over the lip of the handle 186 locking the handle 108. The movement of the handle 108 moves the pawl member in unison thus driving the primary finger 152A of the pawl member 104 around to then bear against the back of the edge of the enclosure 14 face opening, thus pulling the latch 100 and module 20 into the enclosure 10.

Another embodiment of the latch in accordance with the present invention is illustrated in FIGS. 20 through 33. The latch 500 in this second embodiment of the invention is similar in both structure and function to many of the features already described in detail with respect to the latch 100, and for this reason, only the differences in the latch 500 from the latch 100 will be described herein.

In FIGS. 20, 20A through 20E, 21, 21A through 21E, and 22, the second embodiment of the latch 500 is illustrated in the open and closed positions. The latch 500 is designed to be used where a single "finger" pawl member is needed to engage a slot edge of a segmented frame. The latch 500 includes a housing 502, a pawl member 504, a button member 506, a handle 508, a torsion spring 510, a flat spring 511, a mounting clip 513 and pin members 514, and 518.

Figure 23:
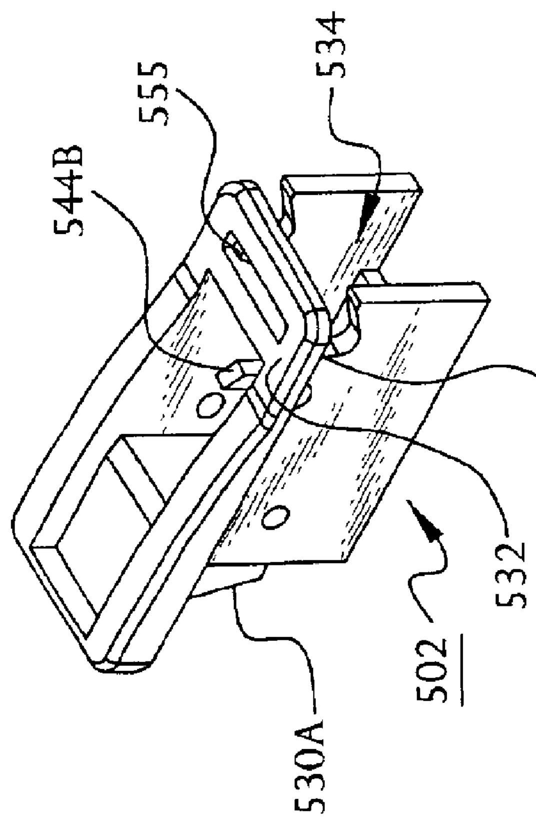
FIG. 23 is a perspective view of the housing of the second embodiment of the latch of FIGS. 21–22.
Figure 23A:
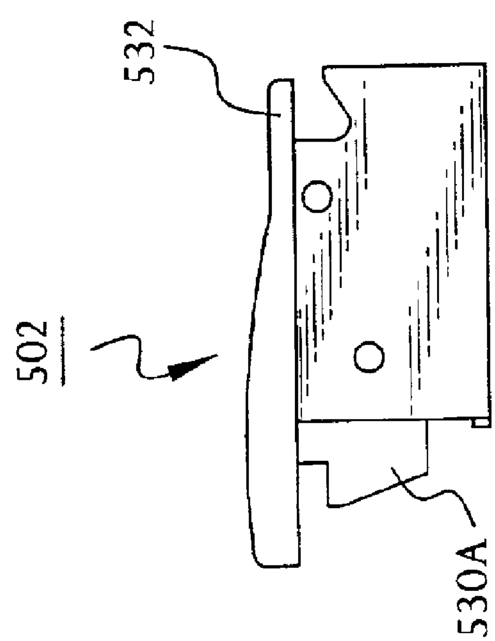
FIG. 23A is a right side view of the housing of FIG. 23.

In FIGS. 23 and 23A, the latch 500 is shown having a housing 502 with a flange 532 and a rear attachment spring mount 530A. A ledge 532A is located under the flange 532 so as to provide conductivity between the housing 502 and the panel 630 so as to prevent EMI and ESD. The spring mount 530A on the backside 522 for attachment of the flat spring 511. On the interior of the housing 502A are ribs 544A, 544B which stop the rotation of the button means 506. A mounting clip aperture 555 traverses the flange 532 above the front side 520 of the housing 502.

Figure 24:
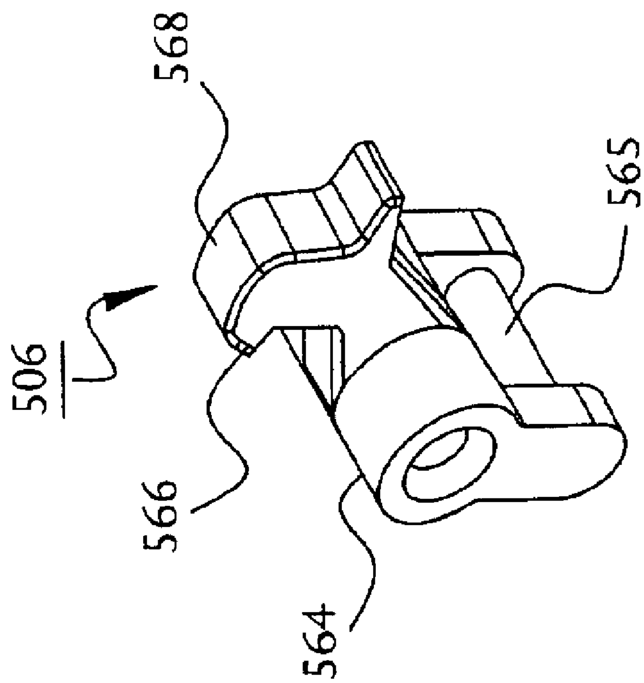
FIG. 24 is a perspective view of the button member of the second embodiment of the latch.
Figure 24A:
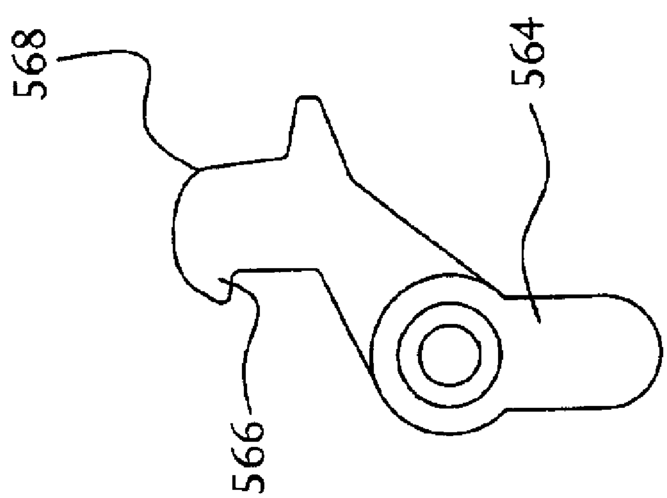
FIG. 24A is a right side view of the button member of FIG. 24.

Referring to FIGS. 24 and 24A, a button member 506 is similar to the button member 106 except for the design of the body portion 564. The body portion 564 comprises a mounting bar 565 for attachment of the torsion spring 510 so as to bias the activation motion of the button member 506.

Figure 25:
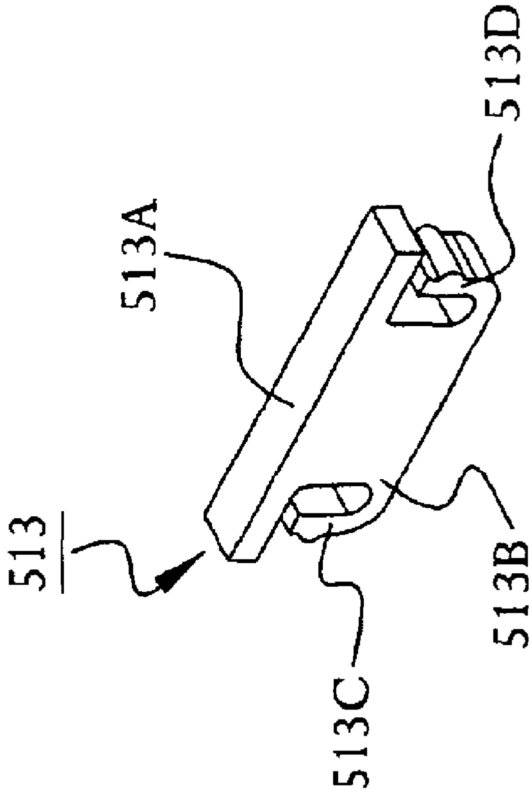
FIG. 25 is a perspective view of the mounting clip of the second embodiment of the latch.
Figure 25A:
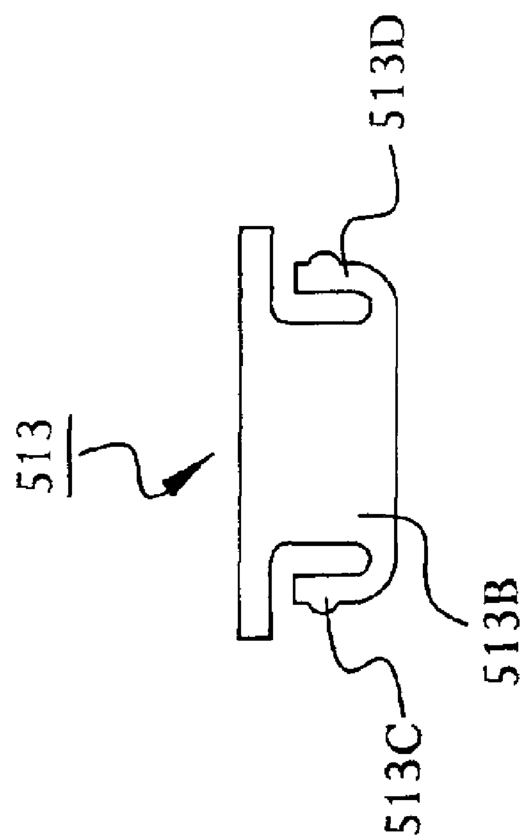
FIG. 25A is a right side view of the mounting clip of FIG. 25.
Figure 26:
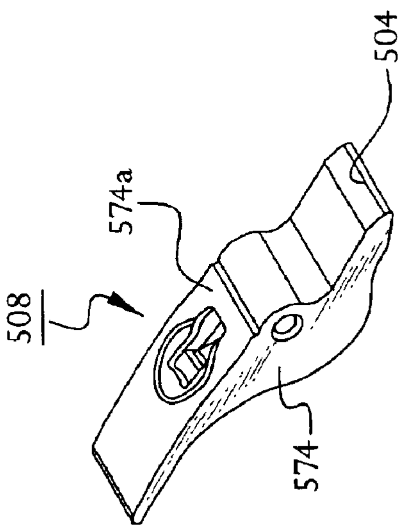
FIG. 26 is a perspective view of the handle of the second embodiment of the latch.
Figure 26E:
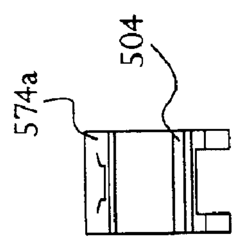
FIG. 26E is a front view of the handle of FIG. 26.
Figure 26B:
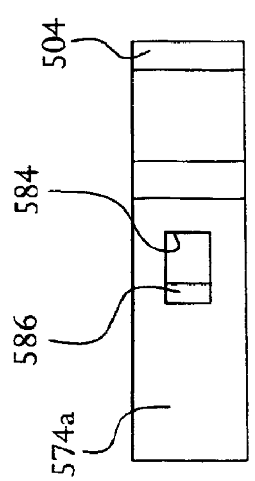
FIG. 26B is a top view of the handle of the second embodiment of the latch.
Figure 26A:
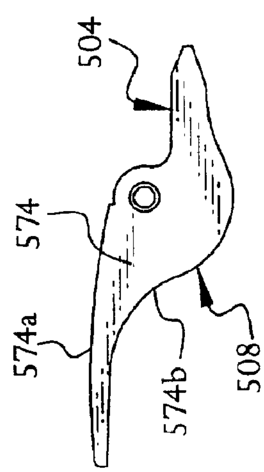
FIG. 26A is a right side view of the handle of FIG. 26.
Figure 26C:
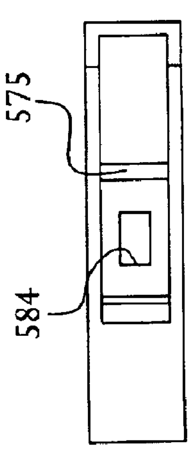
FIG. 26C is a bottom view of the handle of FIG. 26.
Figure 26D:
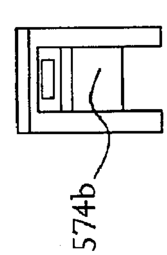
FIG. 26D is a rear view of the handle of FIG. 26.

Shown in FIGS. 25 and 25A, a mounting clip 513 has a flat top surface 513A integral with a body portion 513B which has ribbed U-shaped segments 513C, 513D. The ribbed U-shaped segments 513C, 513D are deformed during installation of the mounting clip 513 through the flange 532. This deformation is a spreading of the U shape. The mounting clip 513 operates as a lock device to secure the housing 502 to the panel 530.

As shown in FIGS. 26 and 26A through 26E, the handle 508 has a body portion 574 with a flat top surface 574A and a contoured bottom surface 574B which converge forward to form a pawl 504. The bottom surface of the handle 574B has a groove 575 wherein the torsion spring 510 is aligned to retard movement when the latch 500 is assembled. As in the first embodiment, the body portion 574 is interrupted midway by a top aperture 584 which allows access to the button member 506. The bottom surface 574A of the body portion 574 extends into the aperture 584 so as to form a lip portion 586.

Figure 27:
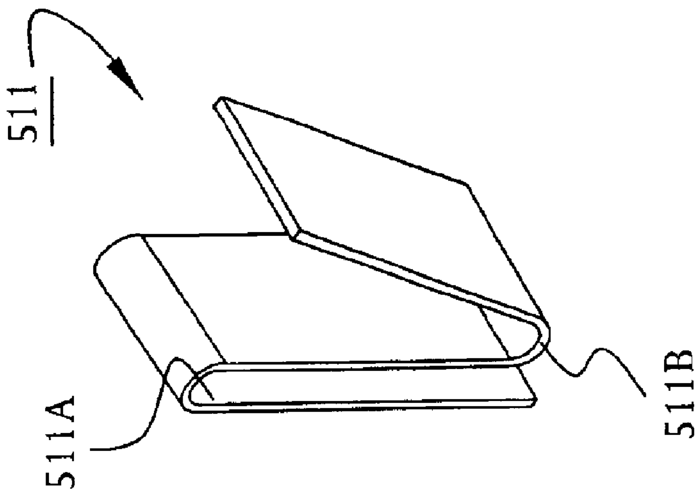
FIG. 27 is a perspective view of the flat spring of the second embodiment of the latch.
Figure 27A:
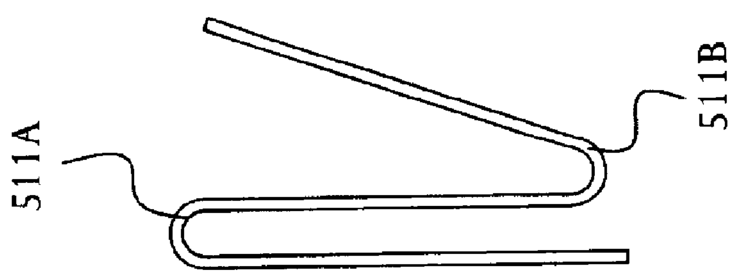
FIG. 27A is a right side view of the flat spring of FIG. 27.

As shown in FIGS. 27 and 27A, the continuous flat spring 511 has a hairpin coil 511A and a obtuse coil 511B. The function of the hairpin coil 511A is for mounting on the spring mount 530A wherein the function of the obtuse coil 511B is biasing the movement of the housing 502 when in the panel as will be discussed further below.

Figure 28:
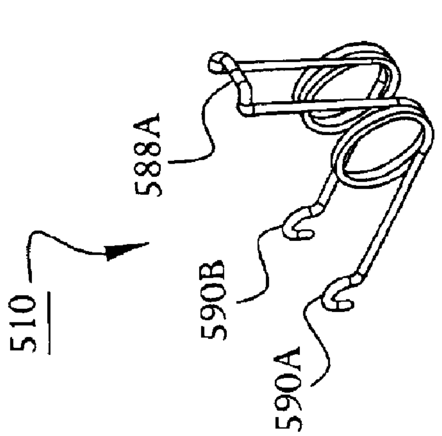
FIG. 28 is a perspective view of the torsion spring of the second embodiment of the latch.
Figure 28A:
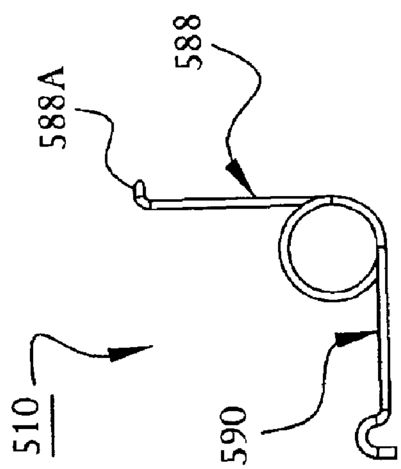
FIG. 28A is a right side view of the torsion spring of FIG. 28.

FIGS. 28 and 28A show the torsion spring has a closed end 588 which forms a camming portion 588A and an open end 590 wherein each end 590A, 590B forms a hook for attachment to the mount bar 565 of the button member 506.

Figure 29A:
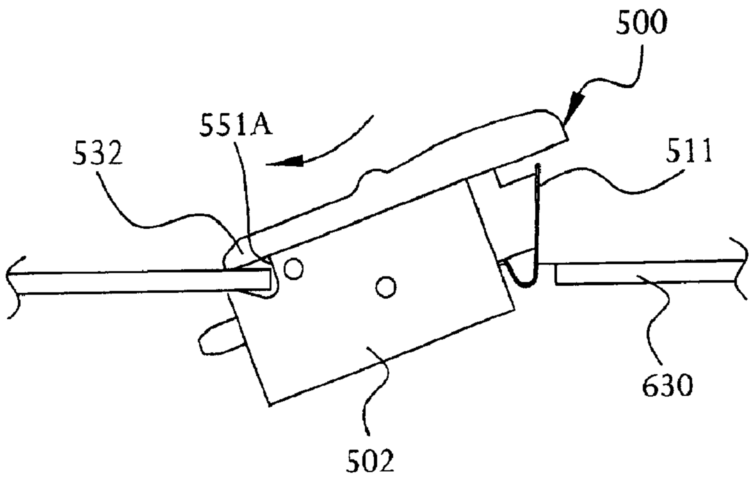
FIG. 29A is a left side assembly view of the second embodiment of the latch and flat spring when being installed into a panel face.
Figure 29B:
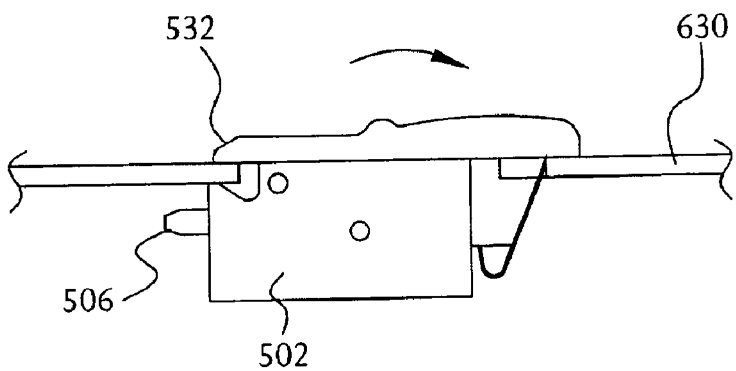
FIG. 29B is a left side view of the assembly of FIG. 29A installed into a panel face but prior to the insertion of the mounting clip.
Figure 29C:
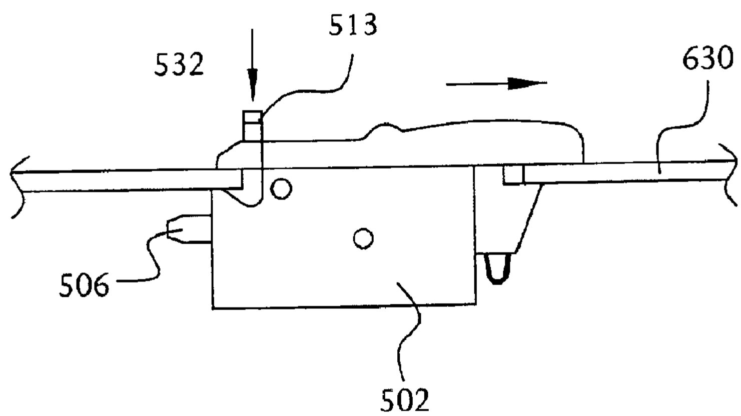
FIG. 29C is a left side view of the assembly of FIG. 29B with the mounting clip inserted.
Figure 30:
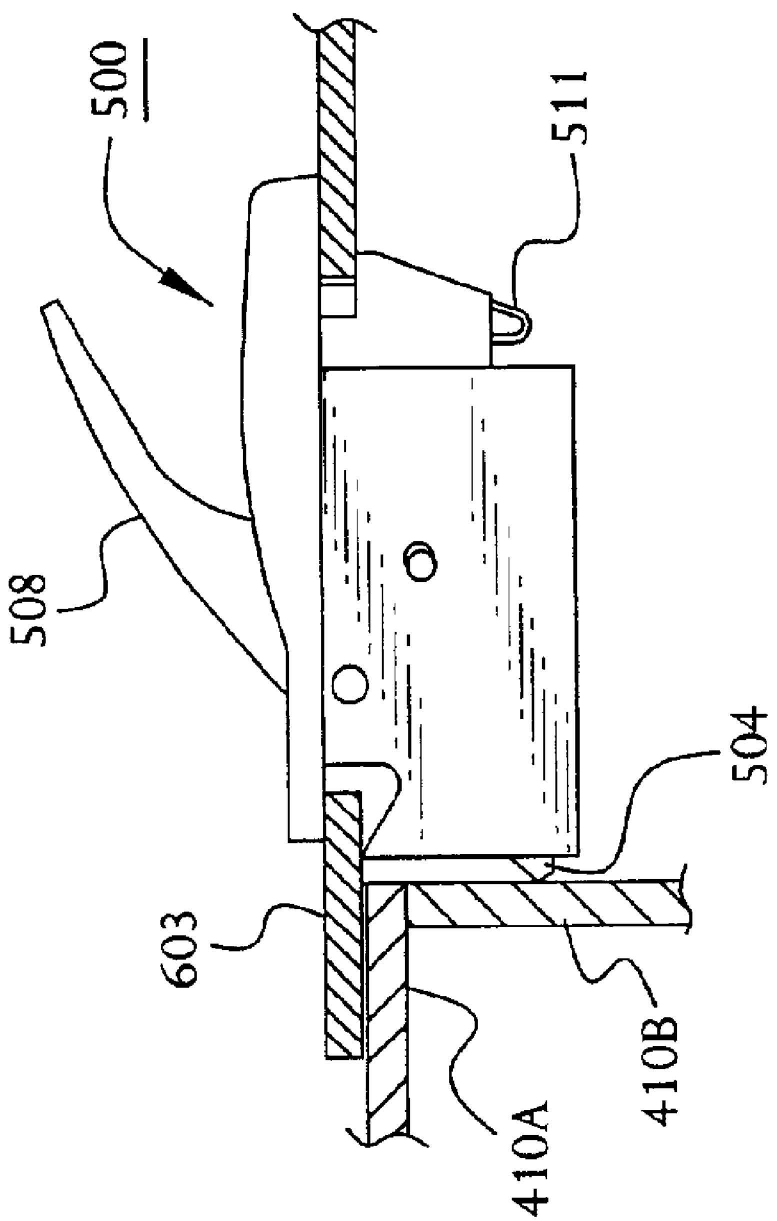
FIG. 30 is a left side view of the assembly of the second embodiment of the latch and flat spring with the pawl member engaging the edge of the enclosure frame.
Figure 31:
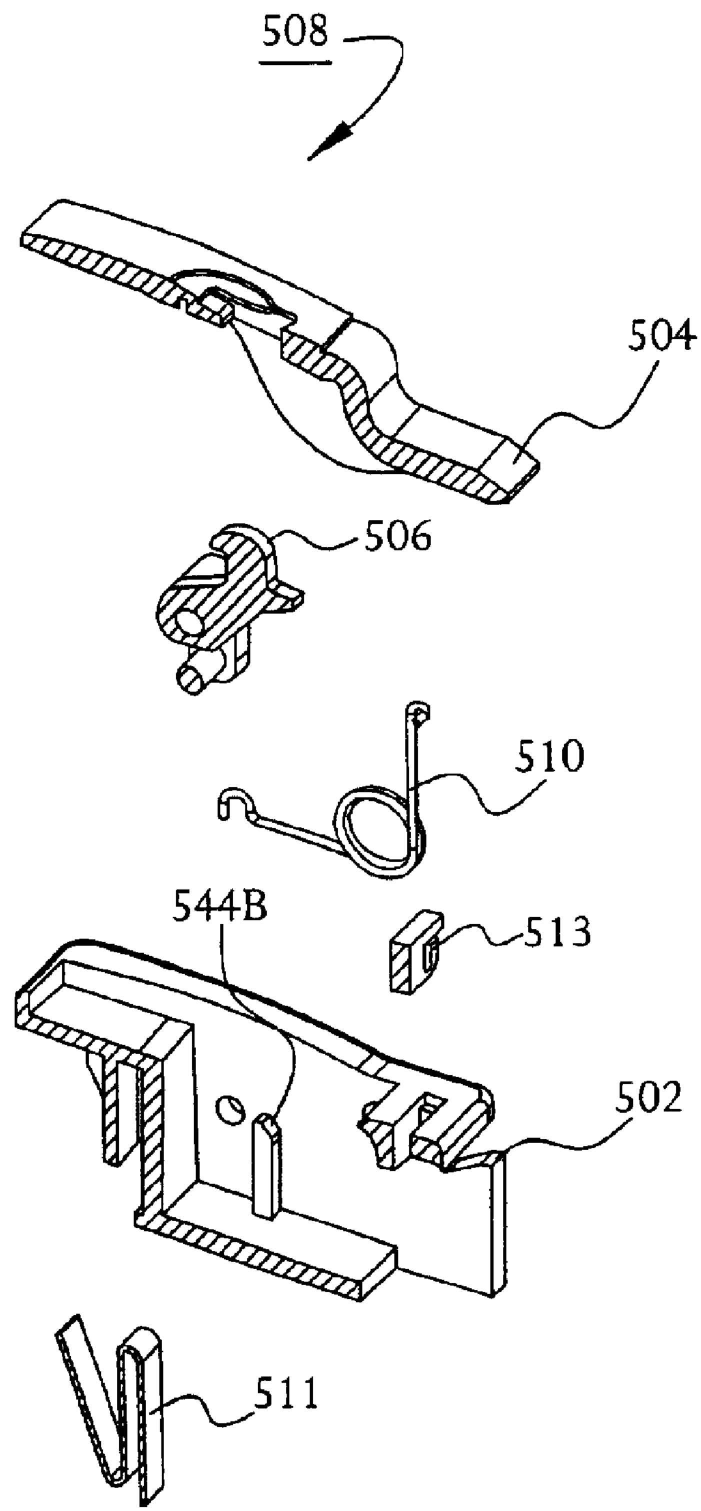
FIG. 31 is a perspective cross-sectional exploded view of the elements of the second embodiment of the latch.
Figure 32:
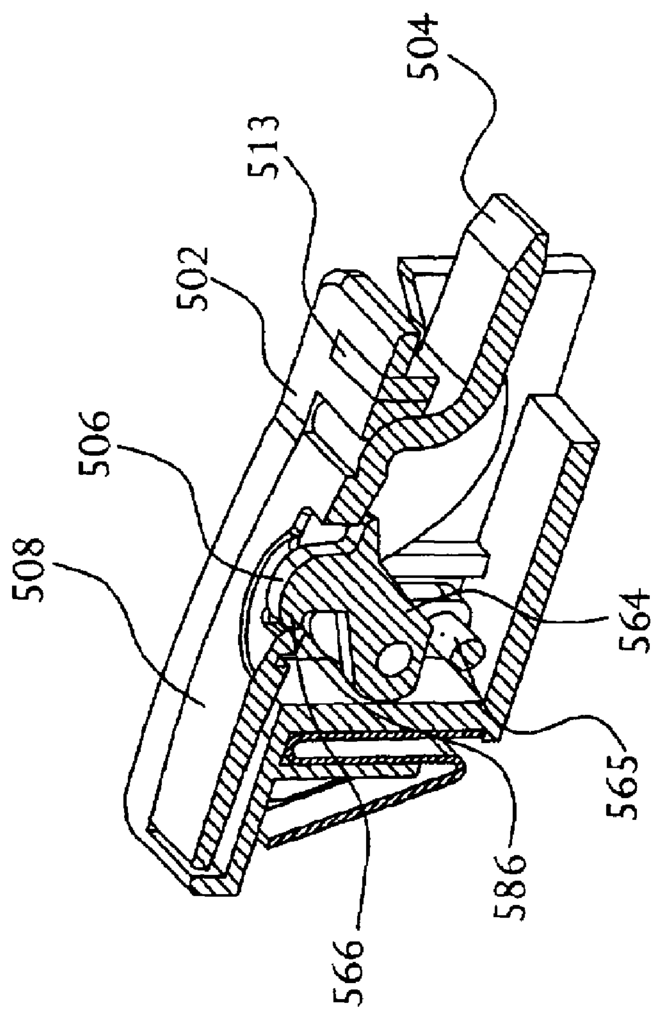
FIG. 32 is a perspective cross-sectional view of the second embodiment of the latch assembled and in the closed position.
Figure 33:
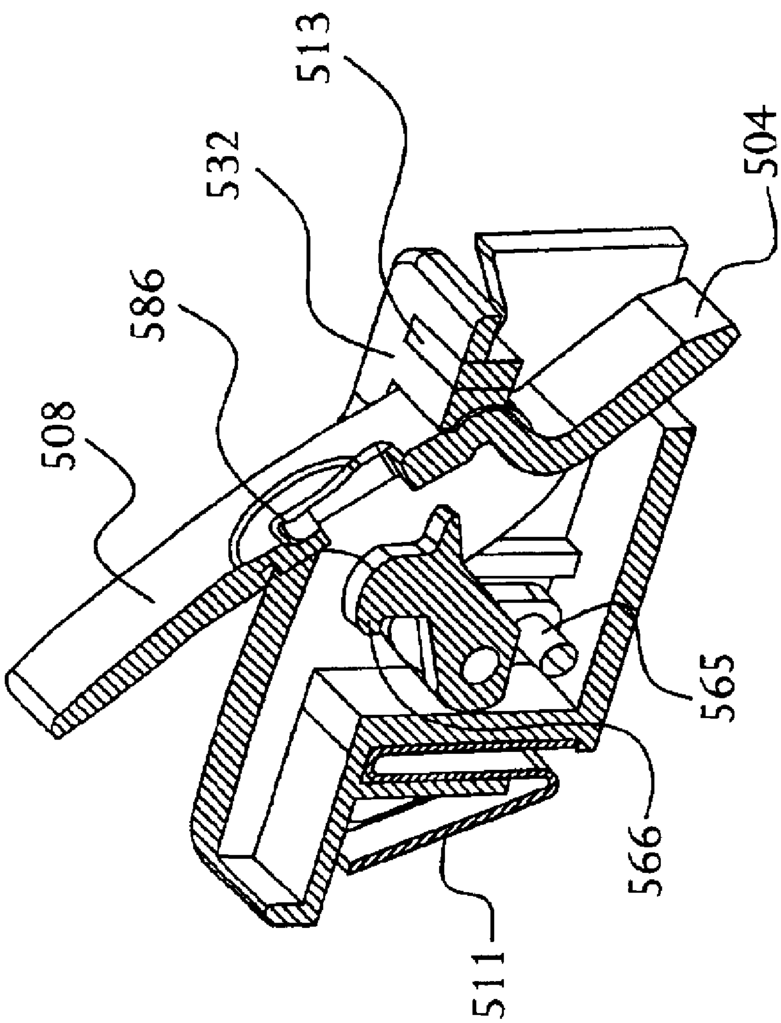
FIG. 33 is a perspective cross-sectional view of the second embodiment of the latch assembled and in the open position.
Figure 34:
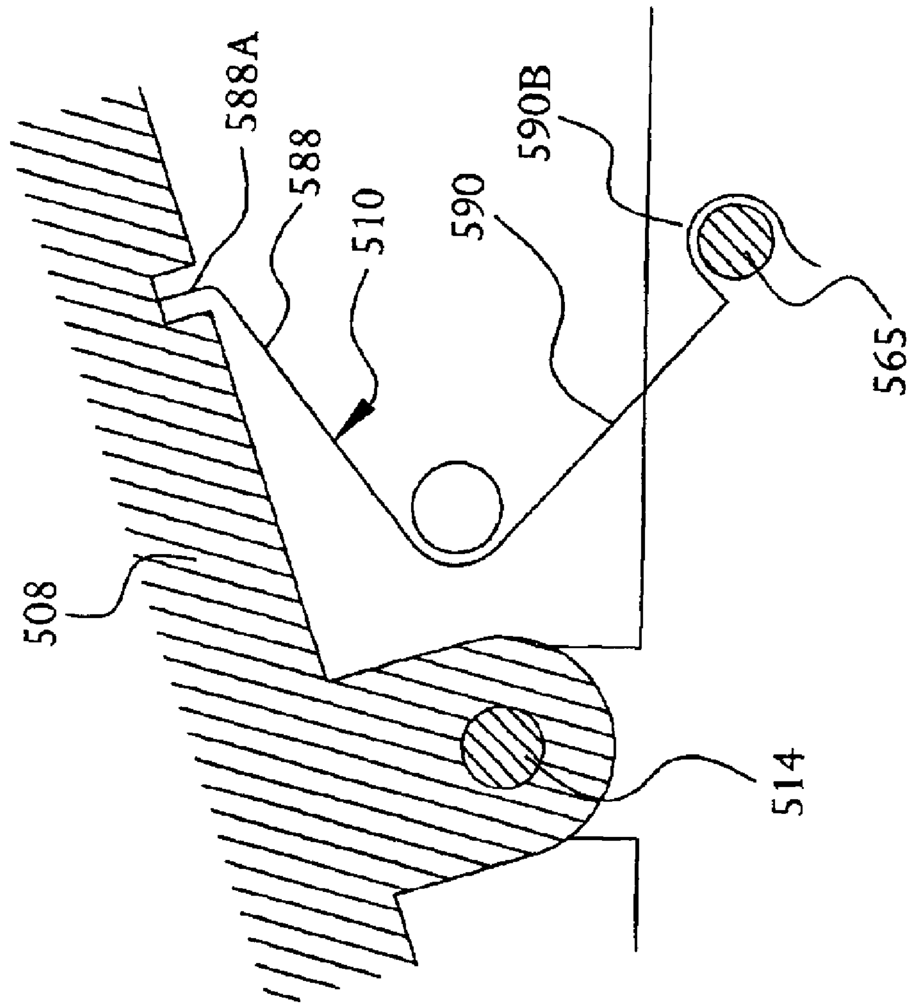
FIG. 34 is a cross-section of the torsion spring of the second embodiment during activation of the latch with a portion of the torsion spring in the groove of the handle and the button member removed.
Figure 35:
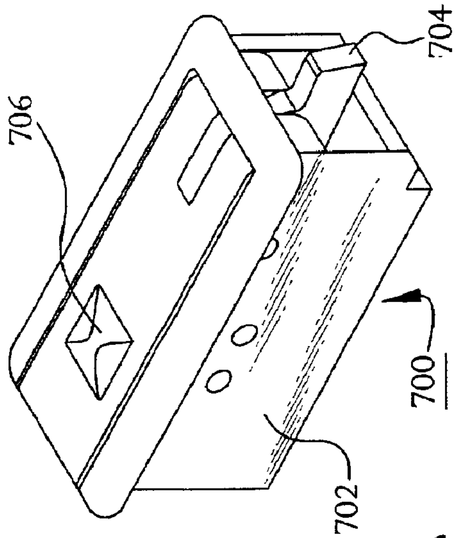
FIG. 35 is a perspective view of a third embodiment of the latch of the present invention in the closed position.
Figure 35E:
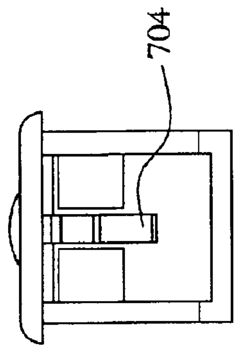
FIG. 35E is a front view the third embodiment of the latch of FIG. 35.
Figure 35B:
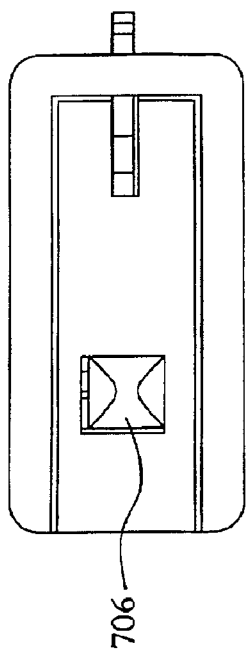
FIG. 35B is a top view of the third embodiment of the latch of FIG. 35.
Figure 35A:
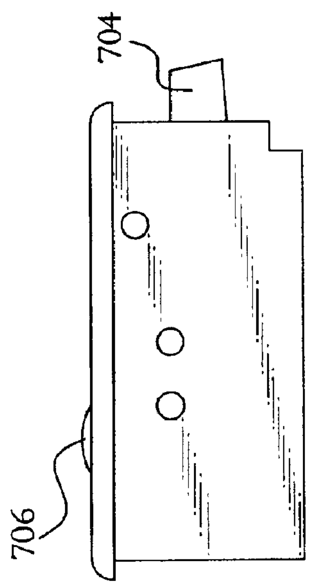
FIG. 35A is a right side view of the third embodiment of the latch of FIG. 35.
Figure 35C:
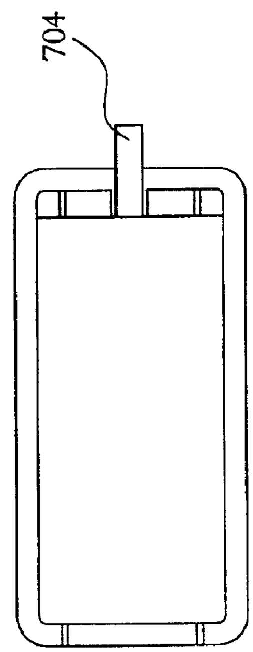
FIG. 35C is a bottom view of the third embodiment of the latch of FIG. 35.
Figure 35D:
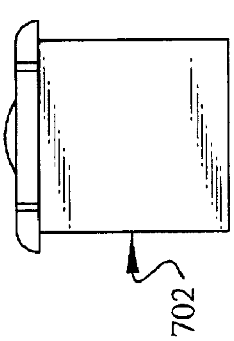
FIG. 35D is a rear view of the third embodiment of the latch of FIG. 35.
Figure 36:
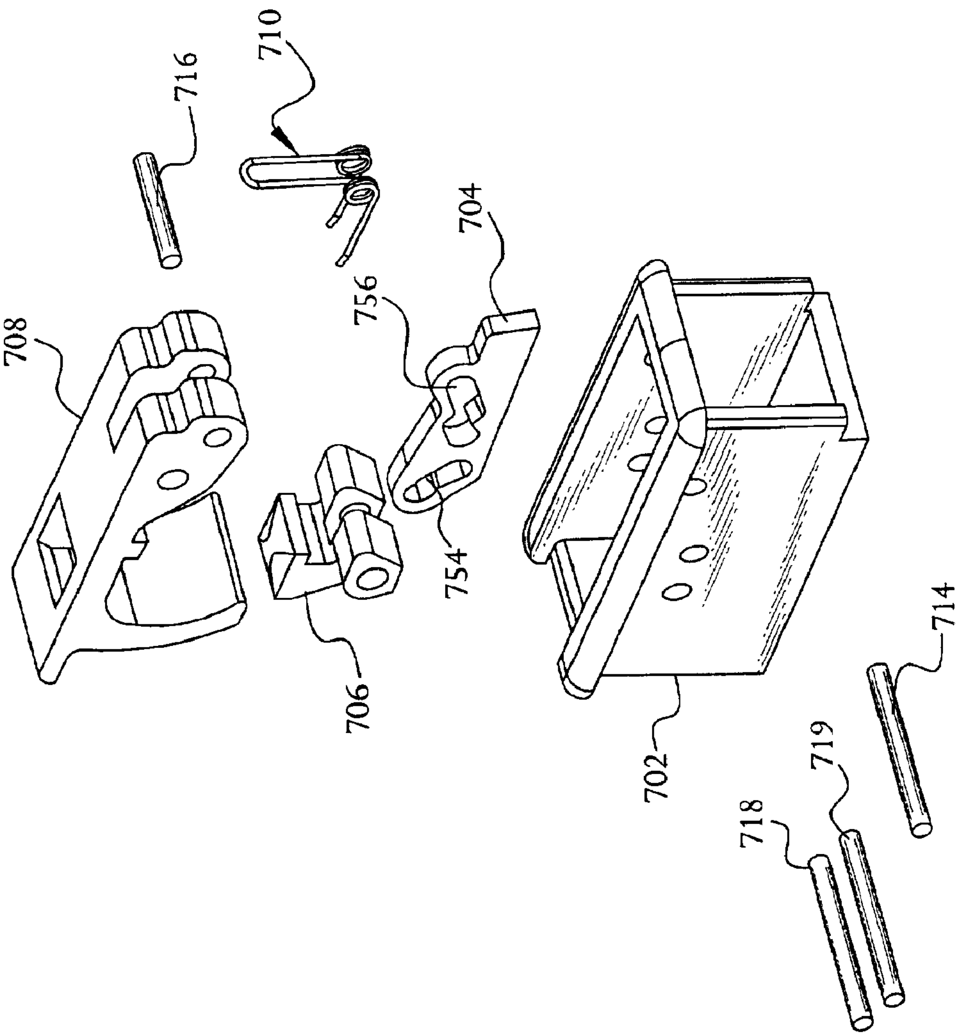
FIG. 36 is a perspective exploded view of the elements of the third embodiment of the latch.
Figure 37:
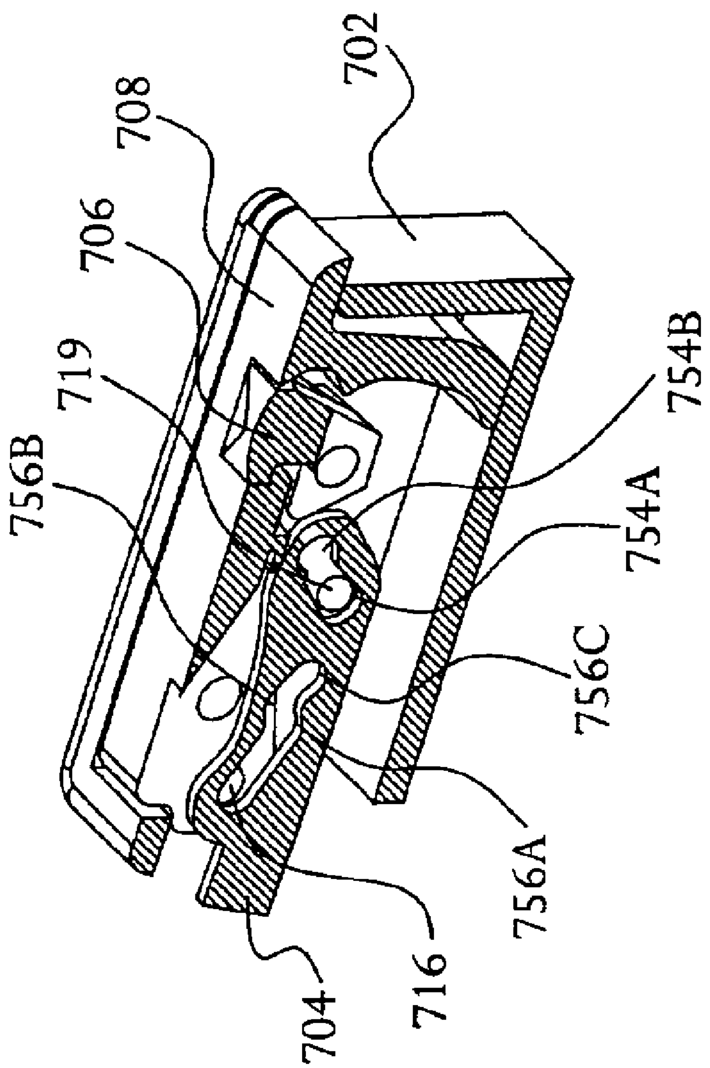
FIG. 37 is a perspective cross-sectional view of the assembled third embodiment of the latch of FIG. 36 in the closed engagement position.
Figure 38:
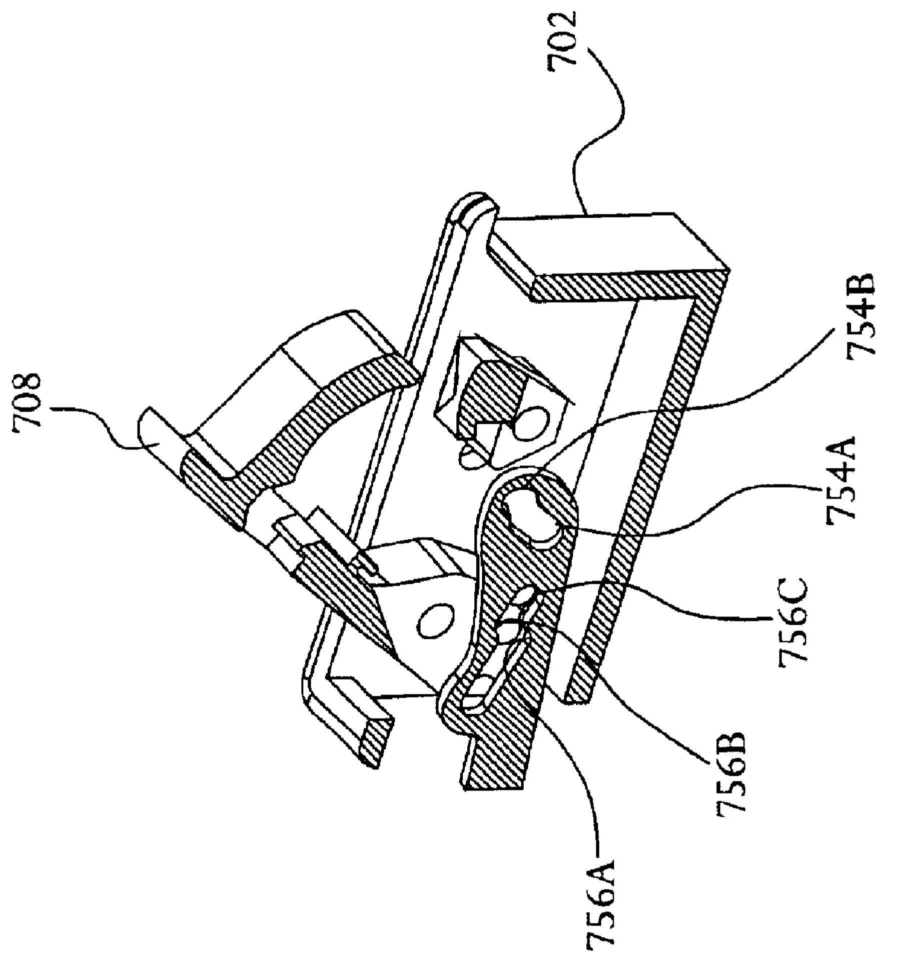
FIG. 38 is a perspective cross-sectional view of the third embodiment of the latch of FIG. 36 in the partially open first position prior to ejection.
Figure 39:
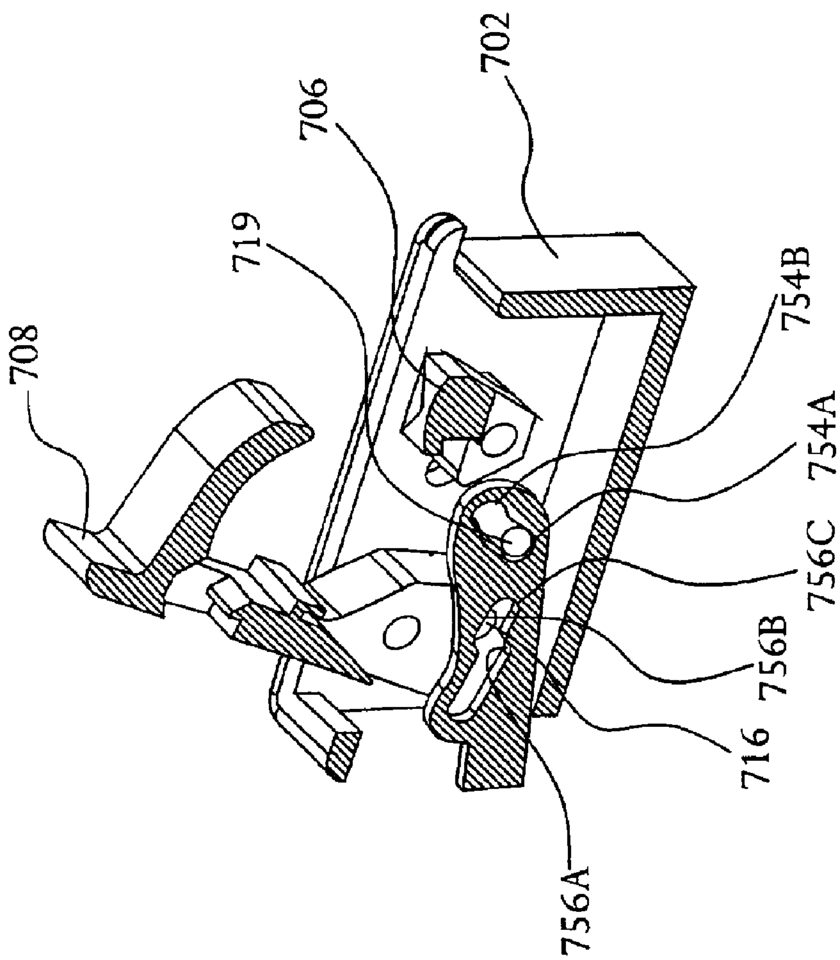
FIG. 39 is a perspective cross-sectional view of the third embodiment of the latch of FIG. 36 in more open second position beginning ejection.
Figure 40:
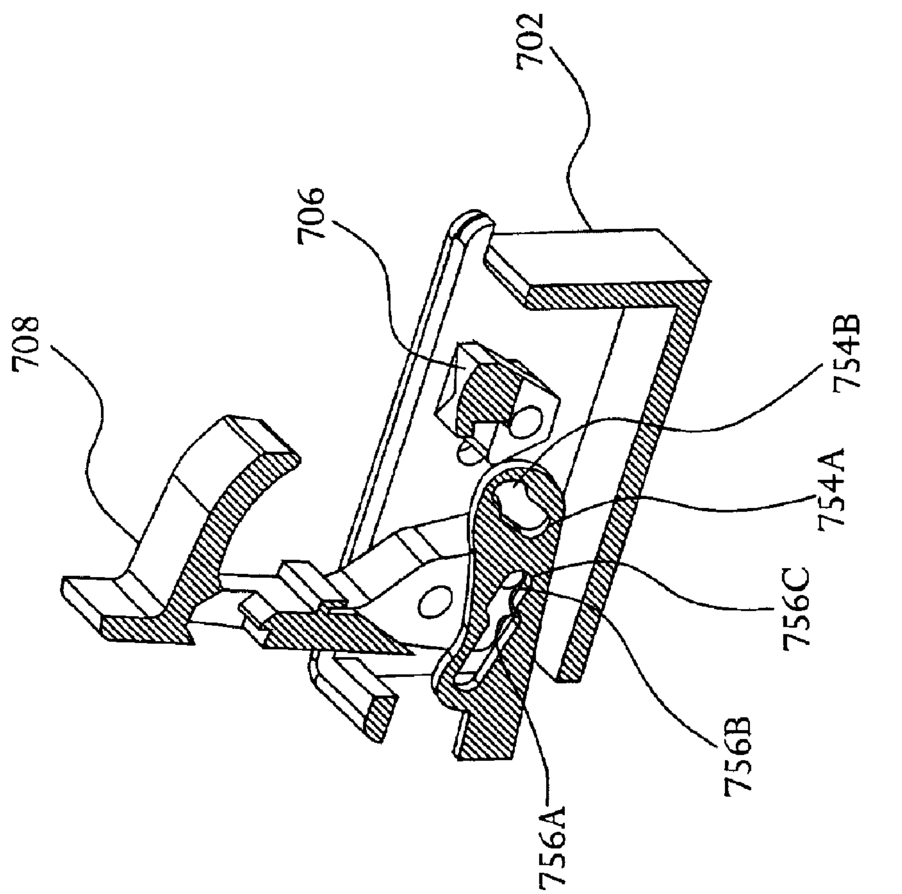
FIG. 40 is a perspective cross-sectional view of the third embodiment of the latch of FIG. 36 in a even more open third position further during ejection.
Figure 41:
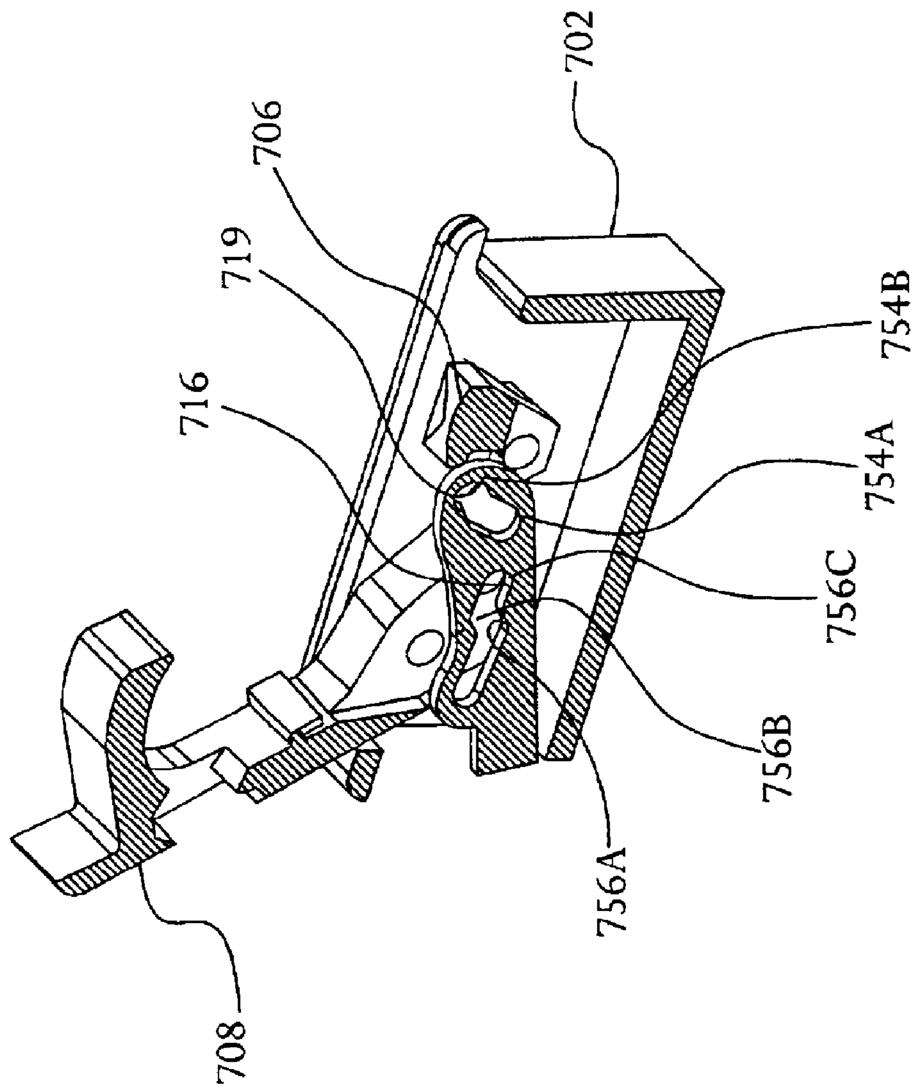
FIG. 41 is a perspective cross-sectional view of the third embodiment of the latch of FIG. 36 in the fully open position after ejection.

Referring to FIGS. 29A through 29C and 30, the latch 500 installs into a rectangular cutout in a panel 630. As shown in FIG. 29A, the latch 500 is installed by nosing it (direction shown by the arrow) into the rectangular cutout to engage the undercuts 551A, 551B at the pawl end of the latch 500. In FIG. 29B, the latch 500 is then pushed further through a cutout (direction shown) until the flange 532 of the housing 502 comes to rest against the panel 630. The latch 500 is then slid in the cutout compressing the flat spring 511. As illustrated in FIG. 29C, while being maintained in the compressed position the mounting clip 513 is pressed (direction shown) into the mounting clip aperture 555, thereby trapping the latch 500 within the panel 630 upon release. Once fully installed, the latch 500 has the ability to move small distances based on the biasing on the flat spring 511. Referring to FIG. 30, this ability is of particular importance because it allows adjustment after the panel 630 has engaged electronics within an enclosure but has not moved the pawl member 504 into the closed position. Compression of the flat spring 511 allows the pawl 504 to "clear" the lower frame member 410B.

A shown in FIGS. 31 through 34, activation of the latch 500 is similar to the preferred embodiment wherein the button member 506 is rotated so as to disengage the lip of the button 566 and the lip of the handle 586. However, this movement is biased by the torsion spring 510 attached to the mounting bar of the button member 506. Rotation of the button member 506 is limited by the ribs 544A, 544B within the housing 502 which act as a stop means for the button member body 564. This allows the pawl member 506 to escape from within the upper 410A and lower parts 410B of an enclosure 510 thereby allowing removal of the module 520. The handle 508 is driven by the camming portion 588A of the torsion spring 510 held with the groove 575 of the handle 508. Engagement closure occurs when the lip of the bottom member 566 is snapped over the lip of the handle 586. This movement of the handle 502 to the closed position is biased by the torsion spring 510.

A third embodiment of a latch in accordance with the present invention is illustrated in FIGS. 35 through 41. The latch 700 of the third embodiment is similar in both structure and function to many of the features already described in detail with respect to the latch 100. Therefore, only the alternate features embodied in the latch 700 will be described.

Referring to FIGS. 35, 35A through 35E, and 36, the third embodiment latch 700 in the closed position. This latch 700 includes a housing 702, a pawl member 704, a button member 706, a handle 708, a torsion spring 710, and pin members 714, 716, 718 and 719. The pawl member has a longitudinal aperture 756 and an rear aperture 754 which are shaped so as to limit the rotation of the handle 708 after disengagement from the button member 706.

Shown in FIGS. 37 to 41, latch 700 activation is accomplished as in the preferred embodiment 100 and the second embodiment 500 wherein the button member 706 disengages the handle member 708. The latch 700 is driven by the torsion spring 710 to a first position as guided by the shape of the longitudinal pawl member 756. The forward pin member 716 is stopped at the first curved portion 756A. Further rotation by the operator will bring the forward pin member 716 to the second curved portion 756B wherein it will stop until further rotation by the operator moves the forward pin member 716 to a third position 756C at the extreme rear end of the aperture 756. Further rotation of the handle 708 moves the middle pin member 719 in the central aperture 754 from a first position 754A to a second position 754B wherein the pawl 704 is forced against the bottom of the housing 730 at full rotation. At full rotation, the handle 708 is at an arc of approximately 115 degrees from the flush position.

Figure 42:
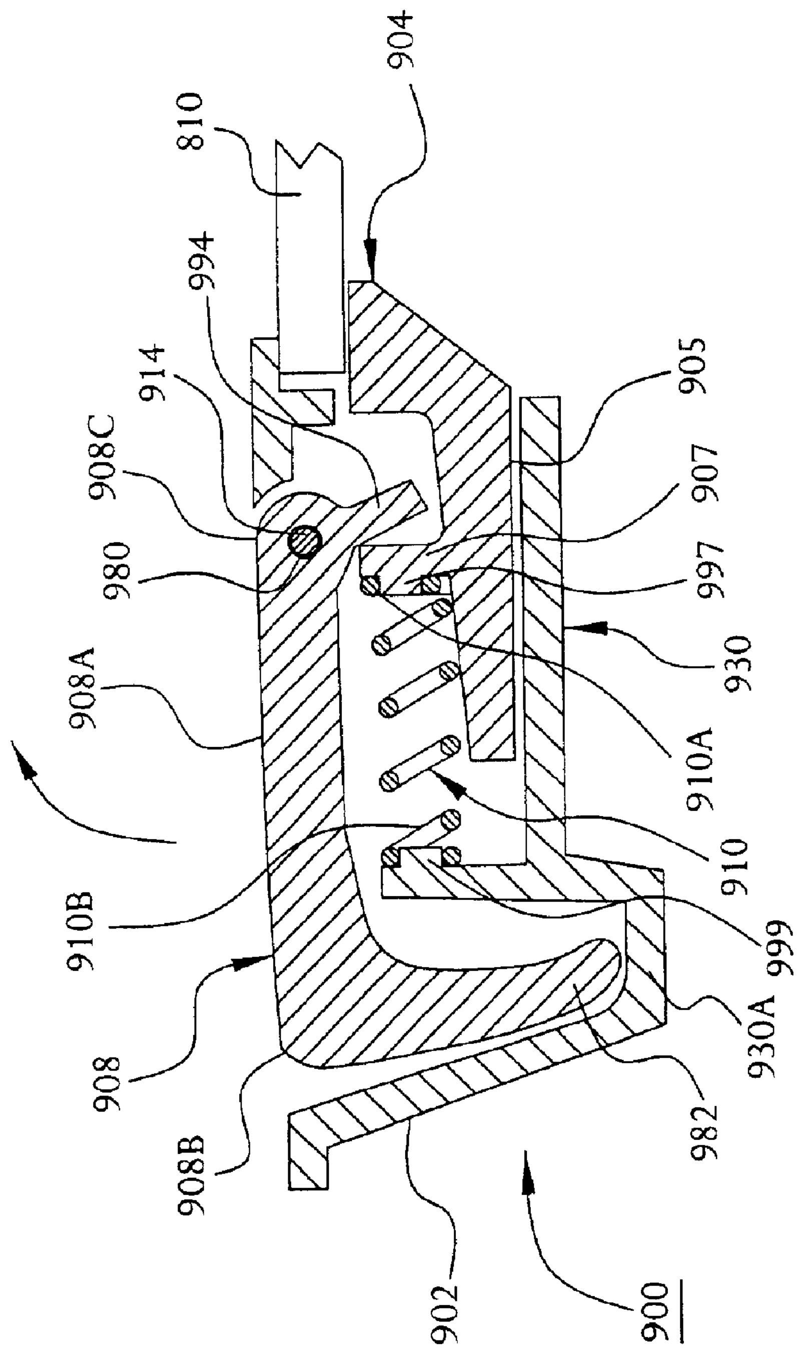
FIG. 42 is a cross-sectional assembly view of a fourth embodiment of the latch of the present invention in the closed position.
Figure 43:
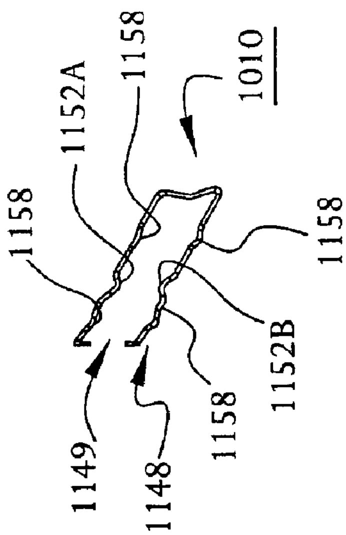
FIGS. 43–46 are perspective, side, end and top views, respectively, of a third retainer being a second embodiment of the wire bail clamp for the latch.
Figure 45:
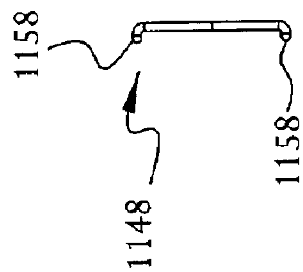
Figure 44:
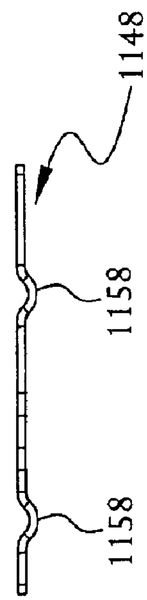
Figure 46:
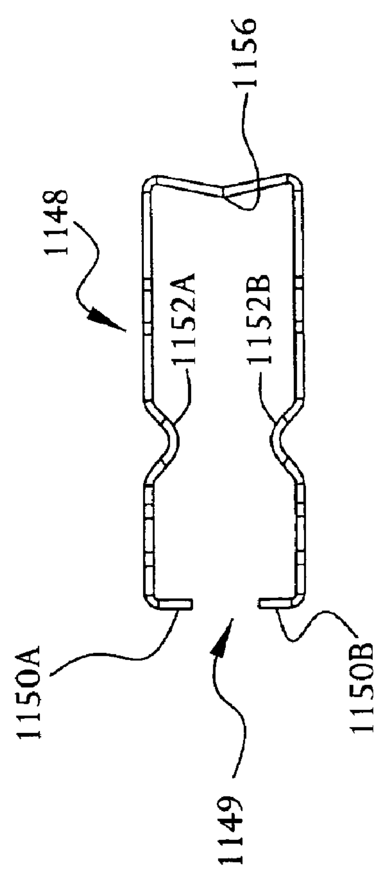
Figure 47:
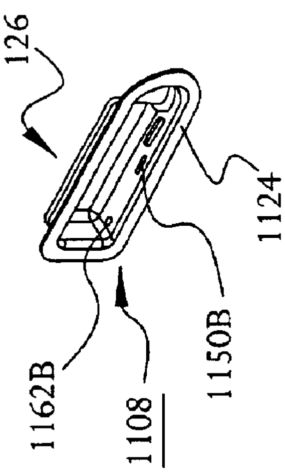
FIGS. 47–50 are perspective, side, end and top views, respectively, of the mating housing carrying receiving openings for use with the second embodiment wire bail clamp of FIGS. 43–46.
Figure 48:
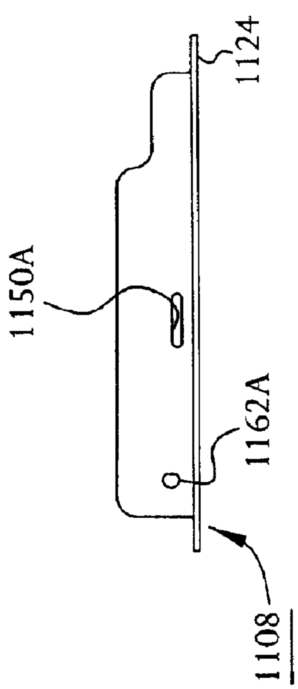
Figure 49:
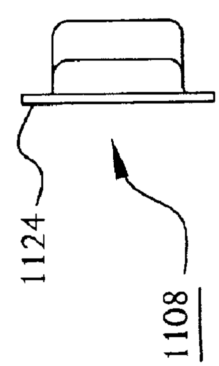
Figure 50:
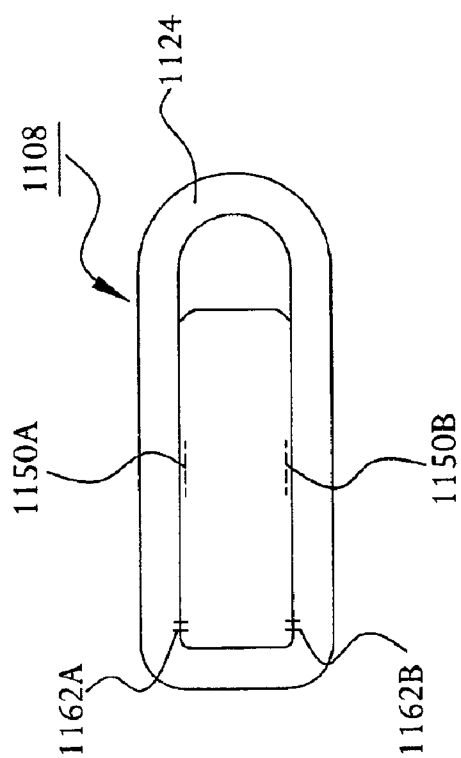
Figure 51:
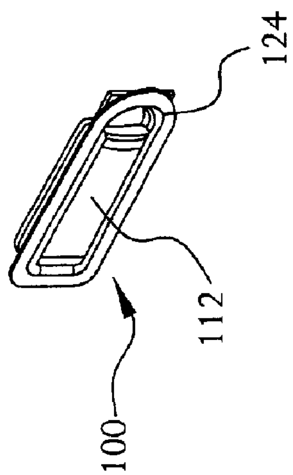
FIGS. 51–54 are perspective, side, end and top views, respectively, of the assembled mating housing and second embodiment wire bail clamp of FIGS. 43–50.
Figure 53:
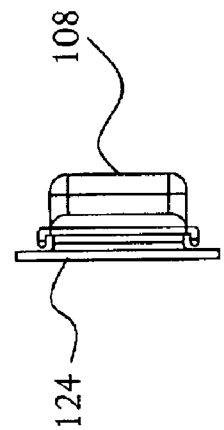
Figure 52:
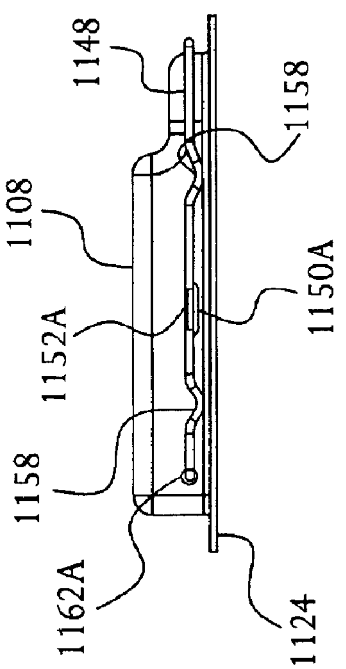
Figure 54:
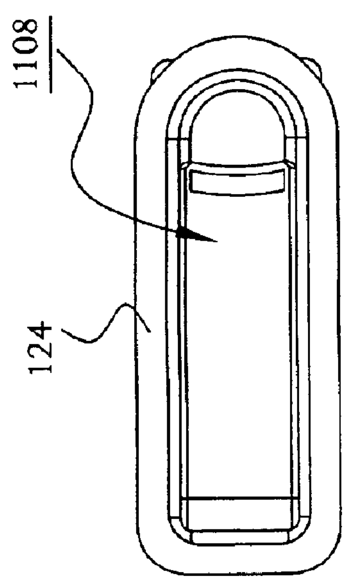

A fourth embodiment of a latch 900 in accordance with the present invention is shown in FIG. 42. This latch 900 is similar in both structure and function to many of the features already described in detail with respect to the latch 100, and for this reason, only the differences between the latch 900 and the latch 100 will be discussed.

Referring to FIG. 42, latch 900 is shown in cross-section, mounted in a panel and in the closed position. The latch 900 includes a housing 902, a pawl member 904, a handle 908, a torsion spring 910, and a pin member 914. The handle 908 has a central portion 908A which is flush with the housing between a first end 908B and a second end 908C. The first end 908B has a hook portion 982 at one end substantially perpendicular to the central portion 908A extending into the housing 902. The central portion 908A terminates at the second end 908B wherein an aperture 980 is located having a pin member 914 there through for rotation of the handle 908. A camming portion 994 substantially perpendicular extends into the housing 902 from the second end 908C.

The pawl member 904 has an elongated tail 905 section which has a perpendicular camming 907 surface aligned with the camming portion 994 of the handle 908. The pawl member 904 slides along the bottom of the housing 930 wherein a space is formed between the pawl member 904 and central portion of the handle 908A wherein a torsion spring 910 is located. The torsion spring 910 is impaled at its forward end 910A on a spring post 997 extending substantially perpendicular to the pawl camming portion 907. The rear end of the torsion spring 910B is impaled on the housing spring post 999 extending from the recessed section of the housing 930A.

Activation of the latch 900 is accomplished by lifting the handle 908 (direction shown) out of the housing 902 by a hook portion of the handle 982 wherein the handle camming portion 994 drives the pawl camming portion 907 rearward thereby disengaging the pawl 904 from the frame 810.

The retainer clamp, FIGS. 9–9E, which is implemented as a wire bail 112, can also be provided as a second embodiment within the present invention, being bail 1148, FIGS. 43–46. This bail 1148, like the first bail 112, is essentially a rectangular-shaped wire loop. This loop has a partially open end 1149 formed by two juxtaposed inwardly extending ends 1150A and 1150B of the wire loop 1148. These wire ends 1150A, 1150B, as with the first embodiment, are inserted into the housing portion of the latch, below its flange, to pivot on the wire ends. This housing mounting an pivoting is identical for both the first and second embodiments, bails 112 and 1148.

The retainer 1148 wire structure includes bends therein at various locations along its length. These bends add to the strength, and resiliency of the bail 1148 after bending. The retainer, bail 1148, carries these bends with at least one projecting portion 1158 extending towards the panel or drawer face plate and extending a sufficient distance to come in abutted contact when the latch is clamped into place after being inserted though the prepared cutout in the panel or drawer face plate.

The bail 1148 has four projecting portions 1158, with two each spaced along each side (side leg) of the loop. The projecting portions 1158 provide the spring force to strongly hold the flange latch housing against the panel (drawer face plate) prevent any play (movement) of the latch when clamped in place, even as the thickness of the panel (drawer face plate) varies within predetermined limits.

The projecting portions 1158 are formed by approximately V-shaped bends in the bail 1148 wire. Alternatively, the projecting portions 158 may be formed by approximately U-shaped bends.

Positioned at approximately mid-length along each side of the bail 1158 is a respective inwardly projecting bend 1152A and 1152B. These mid-length bends 1152A, 1152B face each other and engage slots in the mating housing described below. These housing slot engagement bends 1152A, 1152B engage their respective cooperating housing slots act, as locks to hold the housing and clamp 1148 in the fully clamped position with respect to each other.

The closed end of the wire loop carries a further inwardly facing bend 1156, which extends towards the open end 1149 of the bail 1148. This end bend 1156 engages a cooperating slot in an outwardly extending plate in the panel or drawer face plate when the latch housing is in the fully clamped position, i.e. when the engagement bends 1152A, 1152B engage the housing slots. This engagement locks the bail 1148, and therefore the housing to the abutted back face of the panel or drawer face plate. The engagement of all three bends 1152A, 1152B, 1156, with their respective slots, provides a three point interlocking. These bends 1152A, 1152B, 1156, like the others in the wire loop bail 1148, can be V-shaped or U-shaped.

The second embodiment bail 1148 mating latch housing 1108, FIGS. 47–50, includes a respective receiving elongate slot 1150A, 1150B, one on each side thereof. These receiving slots run parallel to the abutment plane of the mounting panel (drawer face plate) which is also parallel to the housing 1108 flange 1124. On each side wall of the housing 1108. at the end where the pull latch pivots is a receiving pivot hole 1162A, 1162B for receiving a respective one of the wire ends 1150A, 1150B. This permits the bail 1108 to pivot. i.e., rotate relative to the position of the housing 1108 during insertion and removal through the panel (drawer face plate) cutout with notches (bump-outs).

The second embodiment of the bail FIGS. 43–46 and of the mating housing 47–50 are shown as an assembly in FIGS. 51–54. As seem the bail is closed and abuts the flange 1124. When the latch is installed on a panel plate through a cutout, the flange 1124 rides on the outside face of the panel plate and the bail 1148 bends 1158 press against the inside face of the panel plate.

Figure 55:
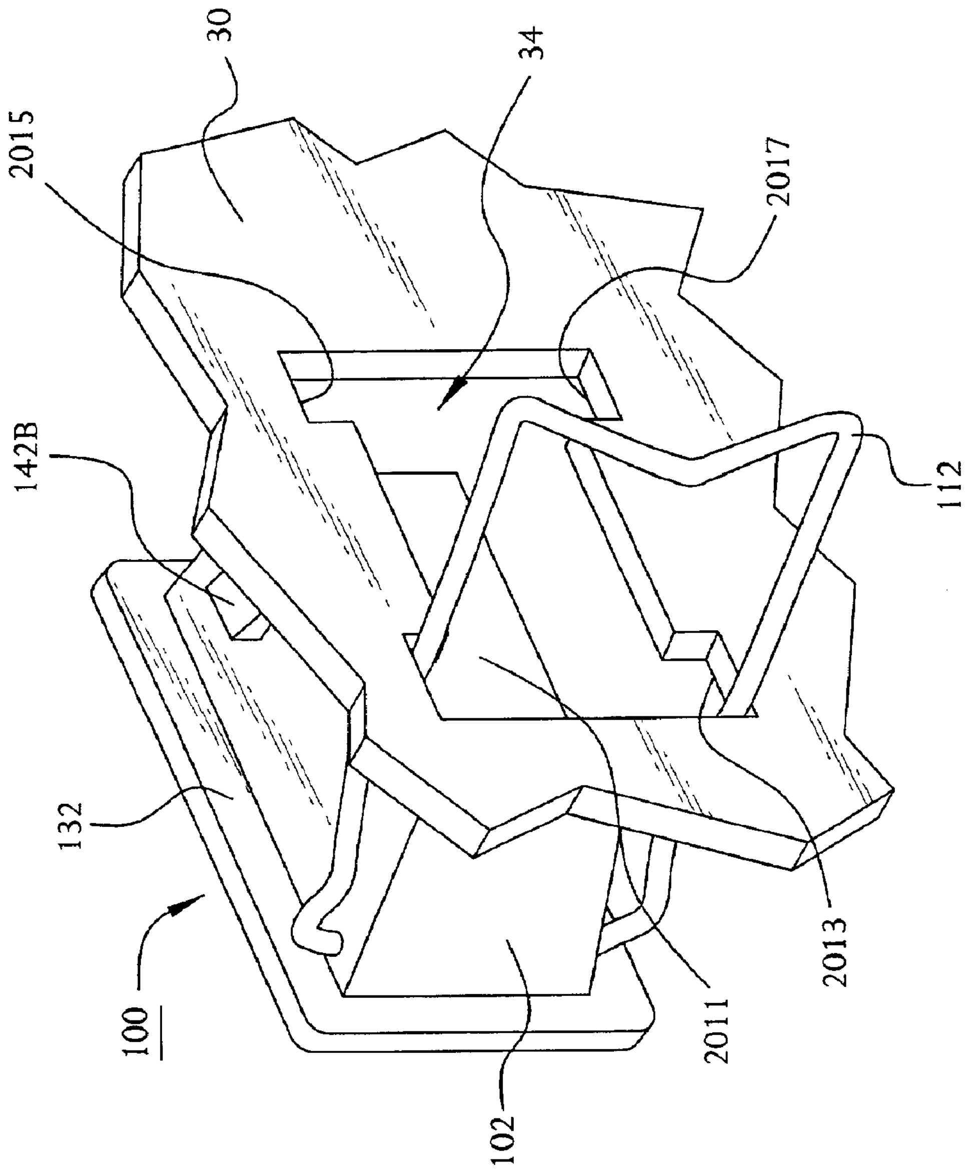
Figure 56:
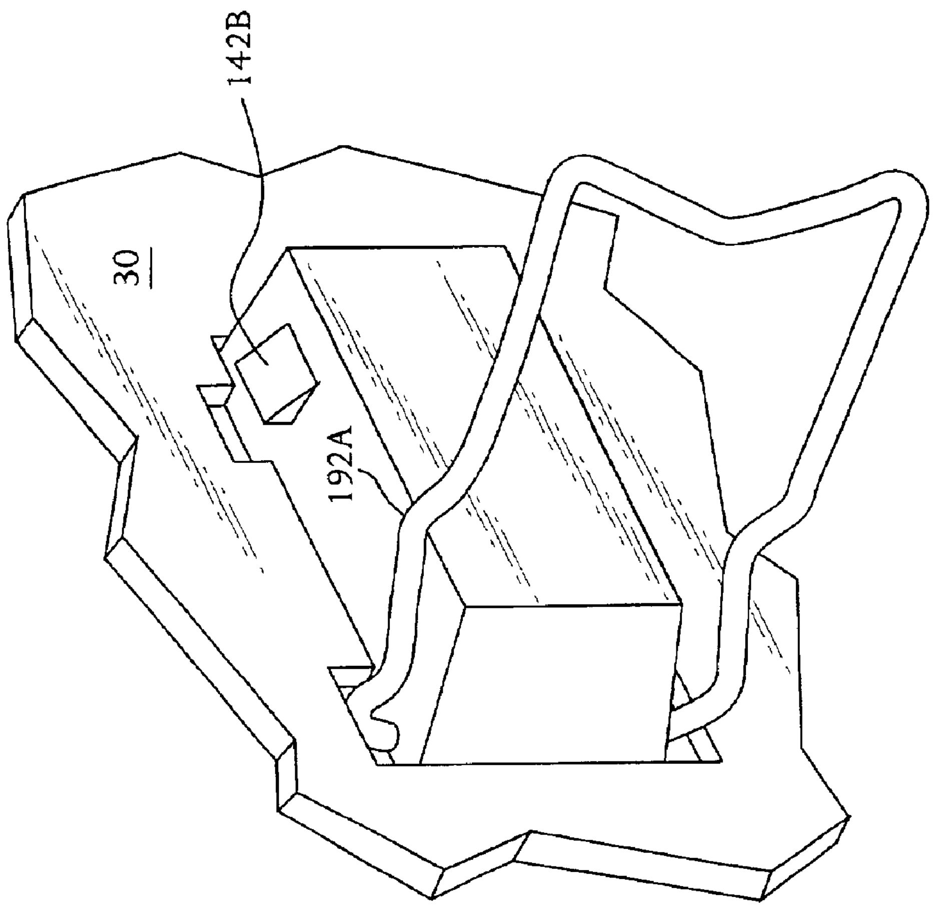
Figure 57:
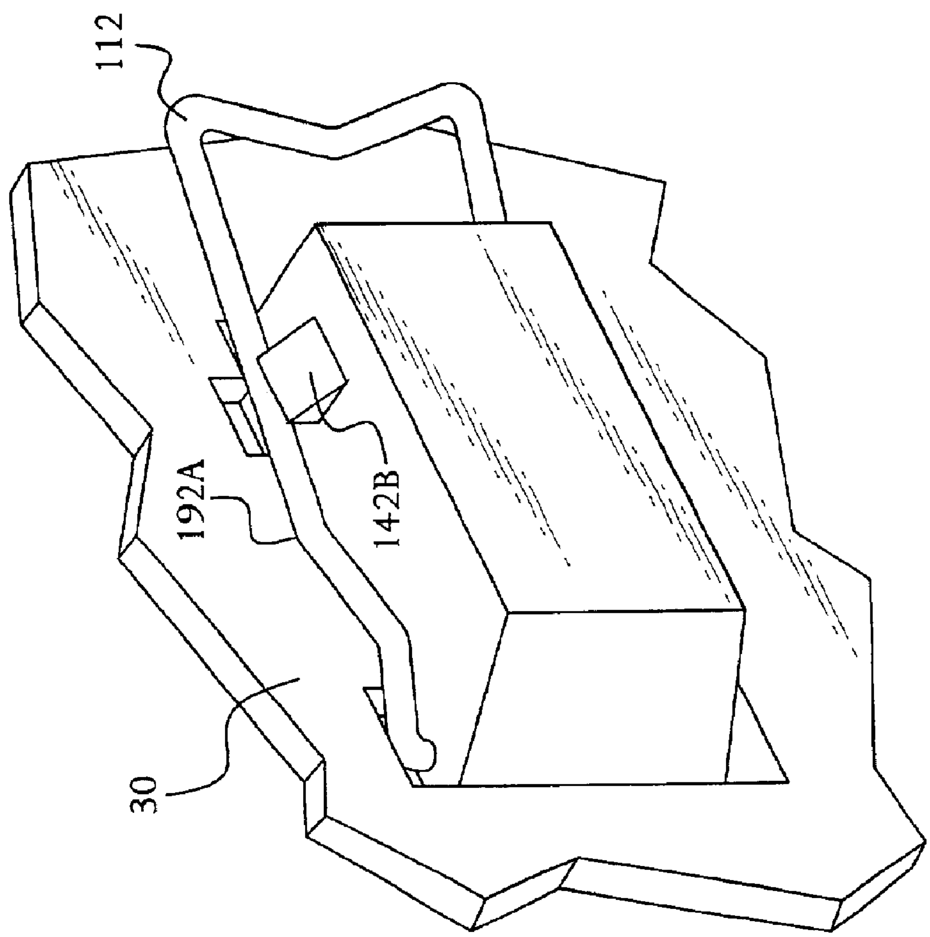
Figure 58:
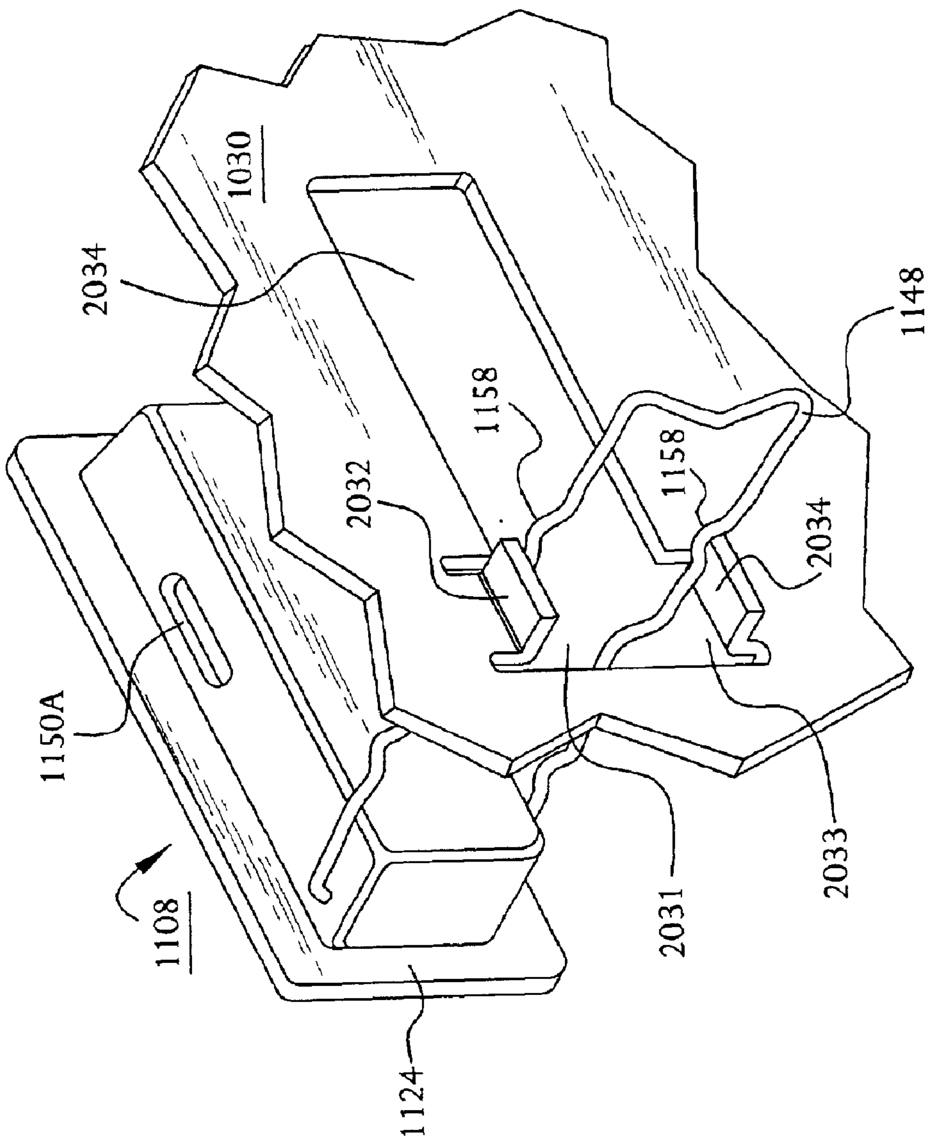
Figure 59:
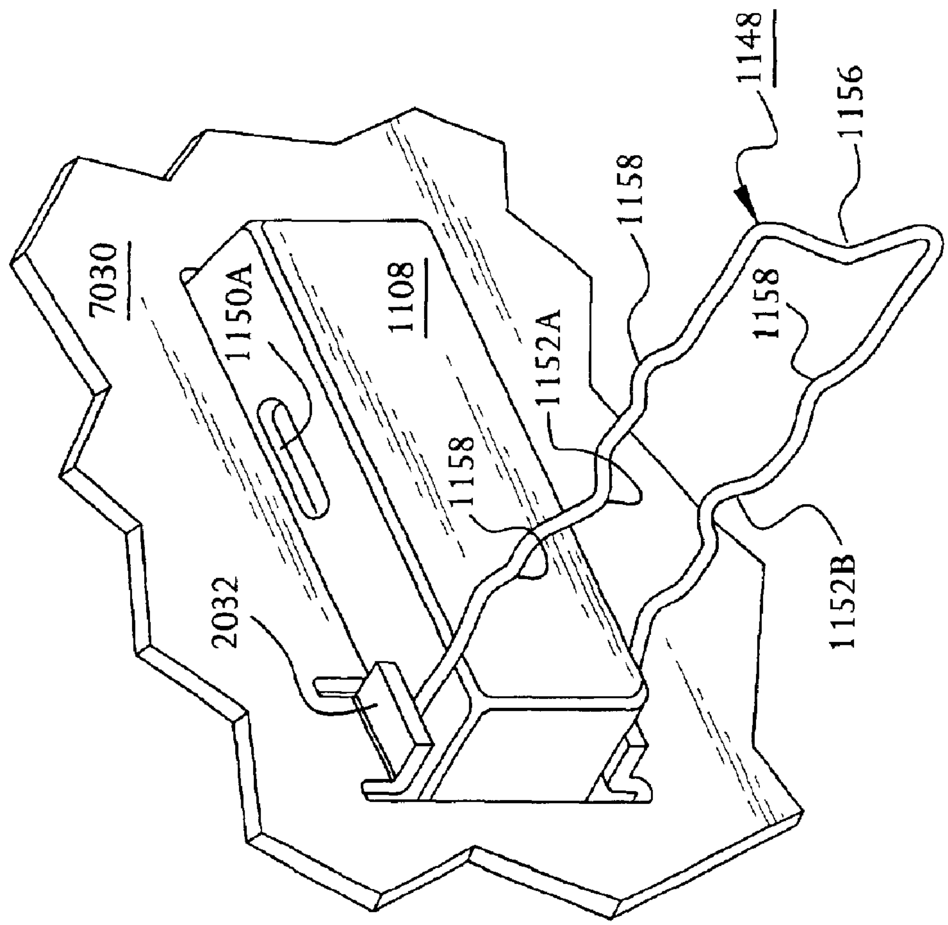
Figure 60:
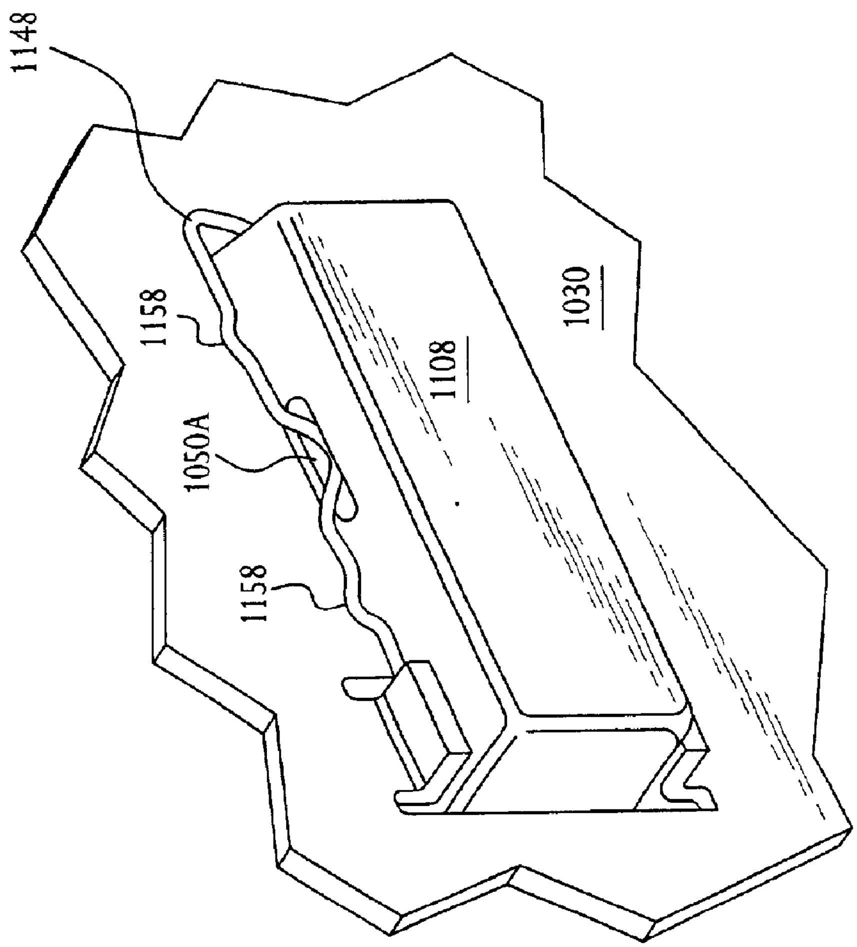

Detailed insertion assembly and bail clamping of the two embodiments of the latch are shown in partial perspective close-up views in FIGS. 55–60, with the first housing and bail embodiments shown in FIGS. 55–57 and the second bail embodiment and matching housing shown in FIGS. 58–60.

Referring to FIGS. 55–57, with the bail 112 rotated at a right angle to the panel plate 30, the bail 112 will pass through the notches 2011, 2013, which are bump-outs in the opposing side edges at a first end of the cutout 34. A pair of notches 2015, 2017 which are bump-outs in the opposing side edges at the second end of the cutout 34 provide space for passage of the ramp projections 142A, 142B which hold and lock the bail 112 in clamped position. The flange 132 seats against the outside face of the panel plate 30, while the bail 112 engages the ramps 142A, 142B. The location of the ramps is such in relation to the thickness of the plate 30, so that the abutment bends 192A, 192AA exert a spring force against the inside face of the plate 30, when rotated to ride over the ramps and be held thereby.

Referring to FIGS. 58–60, with the bail 1148 rotated at a right angle to the panel plate 1030, the bail 1148 will pass through the notch, bump-outs 2031, 2033 in the rectangular cutout 2034 in the plate 1030. The bump-outs 2031 and 2033 are formed by the outward standing plate sections 2032 and 2034, respectively. These plate sections 2032, 2034 act as guides for sliding the bail 1148 through the cutout opening 2034. After the latch housing 1108 is fully inserted, FIG. 59, the bail 1148 is rotated, FIG. 60 so that the engagement bends 1152A, 1152B engage their mating housing receiving slots 1050A, 1050B, and the projecting bends 1158 each come into spring contact with the inside face of the panel plate 1030.

The housing and appropriate components of each latch embodiment are coated with a suitable commercial conductive layer to reduce or eliminate EMI and ESD events.

Many changes can be made in the above-described invention without departing from the intent and scope thereo. It is therefore intended that the above description be read in the illustrative sense and not in the limiting sense. Substitutions and modifications can be made while remaining within the scope and intent this invention including that recited in the appended claims.

What is claimed:

1. An inject-eject latch for holding a module in an enclosure and against a wall thereof, and also selectively releasing it for removal, said latch being releasably mounted to a plate member of said module, said latch comprising:

a housing having a cavity and an open wall;

a pull handle mounted to rotate from one end of the housing outwardly through the housing open wall;

a pawl projecting from one end of the housing and connected to the pull latch to move to a closed position when the pull handle is rotated to be within the housing and said pawl to move to an open position when the pull handle is rotated to the fully open position upwardly from the housing;

a biasing spring positioned to move the pull handle upwardly out of the housing and pawl to the open position;

and a release button connected to the handle and releasing said handle to move under biasing spring force when said button is operated; and a wire-like clamping means for holding the housing to said plate and releasing the housing therefrom, said clamping means being deformable under relatively light pressure to engage and disengage with holding members.

2. The inject-eject latch of claim 1 also including an EMI and ESD preventative coating on said housing.

3. The inject-eject latch of claim 2 also including an EMI and ESD preventative coating on said pull handle, said pawl, said biasing spring, said release button and said clamping means.

4. The inject-eject latch of claim 1 wherein said clamping means includes a wire bail open loop shaped to extend around said housing, rotationally mounted to the side walls of said housing to rotate parallel to the length of the housing and orthogonal thereto.

5. The inject-eject latch of claim 4 wherein said module includes a connector at the rear thereof and said enclosure includes a back plane connector for connecting with and disconnecting from said module connector; and wherein said biasing spring is has a force to perform said module connector injection in to said back plane connector and to perform said module connector ejection form said back plane connector.

6. The inject-eject latch of claim 5 wherein said housing is elongate having two side walls and end walls, and also including a first pivot shaft extending between said housing side walls within said housing cavity adjacent said pawl end of said housing, wherein one end of said pull handle is mounted onto said pivot shaft for rotation.

7. The inject-eject latch of claim 6 also including a second pivot shaft extending between said housing side walls parallel to said first pivot shaft, and wherein said release button includes a rotational journal by which it is mounted for rotation on said second pivot shaft.

8. The inject-eject latch of claim 7 wherein said pull handle includes an opening, and wherein said release button has an outward face which extends through said pull handle opening when said pull handle is in its closed position away from its open outwardly extending position.

9. The inject-eject latch of claim 8 wherein said pull handle opening includes a lip.

10. The inject-eject latch of claim 9 wherein said release button includes a head having a projecting lip, said release button projecting lip engaging said pull handle opening lip when said pull handle is in its closed position.

11. The inject-eject latch of claim 10 wherein said pull handle include a pair of projecting journal plates extending parallel to the side walls of said housing, said projecting journal plates being used to mount said pull handle on said first pivot shaft.

12. The inject-eject latch of claim 11 wherein said release button carries a second lip adjacent its second pivot shaft pivot location, said second lip being blade shaped.

13. The inject-eject latch of claim 12 wherein said pawl is a claw-shaped plate, and also including a third pivot shaft extending between said pull handle projecting journal plates, wherein said pawl plate is mounted for rotation on said third pivot shaft.

14. The inject-eject latch of claim 13 wherein said biasing spring includes a pair of extending fingers, said fingers engaging said release button second lip.

15. The inject-eject latch of claim 14 also including a slot in said pawl plate said slot permitting said third pivot shaft to extend there through.

16. The inject-eject latch of claim 15 also including a slot in each side wall of said housing, wherein the ends of said third pivot shaft extend respectively one each into a respective said side wall slot.

17. The inject-eject latch of claim 16 wherein said wire bail open loop has its two free ends are bent inward, and wherein said first pivot shaft is a hollow tube with open ends, and wherein said wire bail fee end inward bends are fitted into respective open ends of said hollow first pivot shaft for said rotation.

18. The inject-eject latch of claim 17 also including a pair of stops mounted to the opposing side wall of said housing cavity and positioned to act as a rotational stop for the rotation of said release button.

19. The inject-eject latch of claim 18 wherein said pull handle also include a projecting plate foot which seats against the bottom of said housing cavity when said pull handle is in its closed position.

20. The inject-eject latch of claim 19 wherein said housing side wall slots and said pawl plate slot are each curvilinear.

21. The inject-eject latch of claim 20 wherein said clamping means also includes an engagement structure mounted on the outside face of each side wall of said housing, said structure being capable of mating with and holding said wire bail loop.

22. The inject-eject latch of claim 21 wherein said wire bail loop includes a plurality of resiliently flexible bends.

23. The inject-eject latch of claim 22 wherein some of said plurality of wire bail loop bends face said plate when said housing carrying said wire bail loop is mounted on said plate member.

24. The inject-eject latch of claim 23 wherein said engagement structure includes a ramp-shaped projection extending one each from the outside face of side wall of said housing, said wire bail loop being capable of flexible deformation to ride over each ramp-shaped projection and to secured thereby and of flexible deformation to be released there from.

25. The inject-eject latch of claim 24 wherein said flexible deformation of said wire bail loop is accomplished by finger pressure.

26. The inject-eject latch of claim 25 wherein said housing has an EMI and ESD preventative coating.

27. An inject-eject latch for holding a module in an enclosure and against a wall thereof, and also selectively releasing it for removal, said latch being releasably mounted to a plate member of said module through a mounting opening in the plate member, said latch comprising:

a housing having a cavity and an open wall;

a pull handle mounted to rotate from one end of the housing outwardly through the housing open wall;

a pawl projecting from one end of the housing and connected to the pull latch to move to a closed position when the pull handle is rotated to be within the housing and said pawl to move to an open position when the pull handle is rotated to the fully open position upwardly from the housing;

a biasing spring positioned to move the pull handle upwardly out of the housing and pawl to the open position;

and a release button connected to the handle and releasing said handle to move under biasing spring force when said button is operated; and a cradle-like mounting means for holding the housing to said plate and releasing the housing therefrom, said cradle-like mounting means being attached to the bottom of said housing and having upward standing sides being deformable when said housing is inserted or extracted from said mounting opening, said deforming permitting the housing and cradle-like mounting means to slide there through, where upon the cradle-like mounting means returns to shape to press against said plate thereby securing said latch.

28. The inject-eject latch of claim 27 also including an EMI and ESD preventative coating on said housing.

29. The inject-eject latch of claim 28 also including an EMI and ESD preventative coating on said pull handle, said pawl, said release button and said cradle-like mounting means.

30. An inject-eject latch for holding a module in an enclosure and against a wall thereof, and also selectively releasing it for removal, said latch being releasably mounted to a plate member of said module through a mounting opening in the plate member, said latch comprising:

a housing having a cavity and an open wall;

a pull handle mounted to rotate from one end of the housing outwardly through the housing open wall and having a blade extension operating through one end of the housing as a pawl;

wherein the pawl projecting from one end of the housing and connected to the pull latch to move to a closed position when the pull handle is rotated to be within the housing and said pawl to move to an open position when the pull handle is rotated to the fully open position upwardly from the housing;

a biasing spring positioned to move the pull handle upwardly out of the housing and pawl to the open position;

and a release button connected to the handle and releasing said handle to move under biasing spring force when said button is operated; and a flat spring mounting means mounted to the opposite end of the housing from the pawl projection, said flat spring holding the housing to said plate and releasing the housing therefrom, said flat spring being deformable when said housing is inserted or extracted from said mounting opening, said deforming permitting the housing and the flat spring slide there through, where upon the flat spring returns to shape to press against said plate for securing said latch.

31. The inject-eject latch of claim 30 also including a deformable mounting clip for engaging the flat spring and adjusting the position thereof to the edge of said mounting opening.

32. The inject-eject latch of claim 30 also including an EMI and ESD preventative coating on said housing.

33. The inject-eject latch of claim 32 also including an EMI and ESD preventative coating on said pull handle.

34. An inject-eject latch for holding a module in an enclosure and against a wall thereof, and also selectively releasing it for removal, said latch being releasably mounted to a plate member of said module, said latch comprising:

a housing having a cavity and an open wall;

a pull handle mounted to rotate from one end of the housing outwardly through the housing open wall;

a plate-type pawl projecting from one end of the housing and connected to the pull latch to move to a closed position when the pull handle is rotated to be within the housing and said pawl to move to an open position when the pull handle is rotated to the fully open position upwardly from the housing;

a biasing spring positioned to move the pull handle upwardly out of the housing and pawl to the open position;

and a release button connected to the handle and releasing said handle to move under biasing spring force when said button is operated; and a wire-like clamping means for holding the housing to said plate and releasing the housing therefrom, said clamping means being deformable under relatively light pressure to engage and disengage with holding members;

wherein said plate-type pawl includes a longitudinal aperture which is connected to limit the extent of movement of said pull handle after the disengagement from said button.

35. The inject-eject latch of claim 34 also including an EMI and ESD preventative coating on said housing.

36. The inject-eject latch of claim 35 also including an EMI and ESD preventative coating on said pull handle, said plate-type pawl, said release button and said wire-like clamping means.

37. An inject-eject latch for holding a module in an enclosure and against a wall thereof, and also selectively releasing it for removal, said latch being releasably mounted to a plate member of said module, said latch comprising:

a housing having a cavity and an open wall;

a pull handle mounted to rotate from one end of the housing outwardly through the housing open wall;

a pawl projecting from one end of the housing and connected to the pull latch to move to a closed position when the pull handle is rotated to be within the housing and said pawl to move to an open position when the pull handle is rotated to the fully open position upwardly from the housing;

a biasing spring positioned between an inside wall of the housing and a camming portion of the pawl to act to slide the pawl outwardly;

wherein the pull handle includes a hook portion which cames against the camming portion of the pawl to withdraw it into the housing; and a wire-like clamping means for holding the housing to said plate and releasing the housing therefrom, said clamping means being deformable under relatively light pressure to engage and disengage with holding members;

wherein said plate-type pawl includes a longitudinal aperture which is connected to limit the extent of movement of said pull handle after the disengagement from said button.

38. The inject-eject latch of claim 37 also including an EMI and ESD preventative coating on said housing.

39. The inject-eject latch of claim 38 also including an EMI and ESD preventative coating on said pull handle, said pawl and said release button.

40. A bail clamping structure for holding a housing securely to a plate, said housing extending from an outward face of the plate through a cutout opening in the plate, said clamping structure being quick mount and quick release from the inward face of the plate, said clamping structure comprising:

a housing having a face flange extending laterally outwardly thereabout and a pivot accommodating structure at one end thereof;

a bail being sized and shaped to surround a portion of said housing and being pivotally mounted to the pivot accommodating structure of said housing;

wherein said cutout opening is sized to pass said housing and seat said housing face flange against said outer face of said plate;

wherein said cutout opening includes bump-out notch openings to pass said bail when said bail is rotated to extend orthogonal to said notch openings; and receiving structure on opposite sides of the housing for receiving a part of said bail and holding said in fixed engagement with said housing when said bail is rotated to extend parallel to said inside face of said plate; and wherein said bail is in spring force engagement against said inside face of said plate when said bail is in fixed engagement with said housing and said housing seats through said cutout opening with said flange thereof seated on said outside face of said plate.

41. The bail clamping structure of claim 40 wherein said receiving structure is a pair of ramps positioned on opposite sides of said housing, said bail being deformable to ride over said ramps and then be in locked abutment thereto; and wherein said bail includes a plurality of projecting sections which engage said inside face of said plate in spring force engagement thereby effecting a spring force engagement of said bail portions to said ramps resulting in said locked abutment.

42. The bail clamping structure of claim 40 wherein said receiving structure is a pair of elongate slots positioned on opposite sides of said housing;

wherein said bail includes a pair of inwardly juxtaposed facing bends which are capable of engaging and projecting into said housing elongate slots, one said inward bend respectively with a elongate slot said bail being fixed to said housing when said inward bends engage said elongate housing slots; and wherein said bail includes a plurality of projecting sections which engage said inside face of said plate in spring force engagement when said inward bend projectedly engage said elongate slots.

43. The bail clamping structure of claim 42 also including an attachment slot on a plate attached to the inside of said plate; and wherein said bail includes a third bend for engaging said plate slot when said inward bends engage said housing elongate slots thereby fixing said bail to said plate.

wherein said bail is deformable for said inward bends to ride over the housing prior to projecting into said elongate slots.

44. A method for securing and quick release mounting of a housing to a plate, said plate having a outside face and an inside face, which housing when mounted extends through a complementary opening in a plate, comprising the steps of:

providing an opening in said plate for receiving said housing;

providing an abutment structure on said housing for establishing a fully seated position of said housing in said plate opening;

providing a resiliently flexible clamp carried on said housing for fixing said housing securely to said plate when said housing is fully seated in said plate opening;

providing notch-out openings in a portion of said plate opening for passing said clamp;

rotating said clamping to extend orthogonal to said plate opening;

providing clamp engagement structure on said housing side walls;

passing said housing into said plate opening to fully seat it therein by abutting said abutment structure against the outside face of said plate, wherein said orthogonal positioned clamping means passes through said notch-out openings and is entirely on the inside face side of the plate when said housing is fully seated; and rotating said clamping to extend parallel to the inside face of said plate and engaging said housing side wall clamp engagement structure to fix said clamp thereto, whereby said clamp exerts a spring force against the inside face of said plate holding the housing abutment structure fast against the outside face of the plate.

45. The method of claim 44, also including the step of flexibly deforming said clamp to have it engage said housing side wall clamp engagement structure.

46. The method of claim 45 wherein the step of rotating said clamp to extend orthogonal is done under finger pressure; and wherein the step of rotating said clamp to extend parallel to the inside face of said plate is done with finger pressure.

47. The method of claim 46 wherein the step of flexibly deforming said clamp to have it engage said housing side wall clamp engagement structure is deforming with finger pressure.

48. The method of claim 47 also including the steps of:

flexibly deforming said clamp to disengage it from said housing side wall clamp engagement structure;

rotating said clamp to be orthogonal to said plate; and removing said housing and said clamp from said plate by passing said housing out of said plate opening and said clamp though said plate opening notch-outs to be on the outside face of said plate.

49. The method of claim 48 also including before the step of rotating said clamp to extend orthogonal, a step of providing a clamp engagement structure on the inside face of said plate; and wherein the step of rotating said clamp to extend parallel also includes wherein said clamp also engages said plate inside face clamp engagement structure to fix the clamp thereto.

50. The method of claim 49 wherein said step of rotating said clamp to extend parallel wherein said clamp engages said plate inside face clamp engagement structure includes the step of flexibly deforming said clamp to achieve the engagement.

51. The method of claim 50 wherein the step of achieving the engagement of said clamp with said plate inside face clamp engagement structure includes flexibly deforming said clamp with finger pressure.

52. The method of claim 51 wherein the step of flexibly deforming said clamp to disengage it from said housing side wall clamp also includes simultaneously flexibly deforming said clamp to simultaneously disengage it from said plate inside face clamp engagement structure.

53. The method of claim 52 wherein the steps of flexibly deforming said clamp to disengage and the rotating said clamp to be orthogonal are done with finger pressure.

54. A wire bail-type quick mount, quick release, clamping device for holding a housing securely on a plate with the housing having an abutment for seating on the outside face of the plate, said housing extending through an opening in said plate to extend beyond the inside face of said plate, whereof the plate opening has a plurality of notch-outs, said clamping device comprising:

a wire bail mounted onto the side walls of said housing and rotatable from a rotation point on said side wall to extend parallel to the plane of said housing side walls and orthogonal to said housing abutment and also rotatable to extend parallel to the plane of said housing abutment;

wherein when extending parallel to the plane of said housing abutment said wire bail extends along each side wall of said the housing and around one end of said housing forming an open loop;

wherein said wire bail portion lengths for extending along each side wall of said housing defines the two side legs of said wire bail, and wherein said wire bail portion length for extending around one end of said housing defines the end section of said wire bail;

a first resiliently flexible bend in each side leg of said wire bail;

a wire bail engagement and holding member on each sidewall of said housing, wherein said engagement is achieved by deforming said wire bail side legs to ride over said housing side walls; and wherein said wire bail rotation point is positioned to pass the wire bail in orthogonal position and said wire bail engagement and holding members through said plate opening notch-outs when said housing is inserted into said plate opening.

55. The device of claim 54 wherein said side leg section bends extend towards the plane of said plate when said wire bail is rotated to extend parallel to the plane of said plate.

56. The device of claim 55 wherein said rotation point for said wire bail is located to have said wire bail entirely on the inside of said plate when said housing is fully seated with said housing abutment against said outside face of said plate.

57. The device of claim 56 wherein said side legs section bends extending towards the plane of said plate resiliently engage the inside face of said plate when rotated parallel thereto and said wire bail is held by said housing side wall engagement members.

58. The device of claim 57 wherein said wire bail side legs are each resiliently deformable under finger pressure.

59. The device of claim 58 also including a bend in the end section of said wire bail.

60. The device of claim 59 wherein the free end of each side leg of said wire bail includes a rotational end being a turn in of the wire with the turn in extensions being juxtaposed.

61. The device of claim 60 wherein the end section bend of said wire bail extends towards the free end of said wire bail.

62. The device of claim 61 wherein each said wire bail engagement and holding member is a projection from a respective side wall of said housing.

63. The device of claim 62 wherein said finger pressure resilient deformation of each wire bail side leg is sufficient for each side leg to pass over a respective projection to be held in fixed position thereby.

64. The device of claim 63 wherein each said housing side wall projections includes a ramped outer face.

65. The device of claim 64 wherein each side leg of said wire bail includes a second resiliently flexible bend extending in the same direction as the first bend in the side leg.

66. The device of claim 65 wherein each said bend in said wire bail is a V-shaped bend.

67. The device of claim 61 wherein each said wire bail engagement and holding member is an elongate slot in a respective side wall of said housing, and wherein each side leg of said wire bail also includes a second bend positioned and pointing to engage a respective housing side wall slot.

68. The device of claim 67 also including a plate extending away from the inside face of said plate and positioned to receive the wire bail end section bend.

69. The device of claim 68 also including a plurality of slide plates extending outwardly from the inside face of said plate, said slide plate contacting said housing side walls when said housing extend through said plate opening.

70. The device of claim 69 also including a third resiliently flexible bend in each wire bail side leg extending parallel to said first bend.

71. The device of claim 70 wherein the first and third bends in each side leg of said wire bail and the end section bend of said wire bail are V-shaped.

72. The device of claim 71 wherein the second slot engaging bend in each wire bail side leg is U-shaped.

* * * * *

UNITED STATES PATENT AND TRADEMARK OFFICE

CERTIFICATE OF CORRECTION

PATENT NO. : 6,957,979 B2 
DATED : October 25, 2005
INVENTOR(S) : Thomas Welsh et al.

It is certified that error appears in the above-identified patent and that said Letters Patent is hereby corrected as shown below:

Column 1,
Line 31, insert -- to -- between “used” and “hold”;

Column 3,
Line 13, replace “thought” with -- through --;
Line 52, insert -- of -- between “top view” and “the housing”;
Line 53, insert -- of -- between “bottom view” and “the housing”;
Line 55, insert -- of -- between “rear view” and “the housing”;
Line 56, insert -- of -- between “front view” and “the housing”;

Column 5,
Lines 37 and 49, insert -- of -- between “front view” and “the second”;

Column 9,
Line 7, replace “(operator0” with -- (operator) --;

Column 10,
Line 28, replace “to” with -- two --;
Line 62, replace “enclosure face 12” with -- enclosure 10 face --;

Column 11,
Line 2, replace “from face of the enclosure 12.” with -- front face of the enclosure 10. --;
Line 13, replace “enclosure 14 face opening” with -- enclosure 10 face opening --;

Column 14,
Line 2, replace “inserted though the” with -- inserted through the --;
Line 13, replace “158” with -- 1158 --;
Line 16, replace “bail 1158” with -- bail 1148 --;
Line 49, insert -- Figs. -- before “47-50”;
Line 50, replace “As seem” with -- As seen --;

Column 16,
Line 2, delete “are” between “ends” and “bent”;
Line 4, replace “fee” with -- free --;

Column 17,
Line 6, replace “secured thereby and of flexible” with -- be secured thereby and flexible --;

UNITED STATES PATENT AND TRADEMARK OFFICE

CERTIFICATE OF CORRECTION

PATENT NO. : 6,957,979 B2
DATED : October 25, 2005
INVENTOR(S) : Thomas Welsh et al.

It is certified that error appears in the above-identified patent and that said Letters Patent is hereby corrected as shown below:

Column 19,
Line 18, replace “cames” with -- cams --;
Line 20, replace “holding said in fixed” with -- holding in fixed --.

Signed and Sealed this

Twenty-first Day of March, 2006

JON W. DUDAS
*Director of the United States Patent and Trademark Office*